(12) United States Patent
Adegawa

(10) Patent No.: US 6,528,233 B2
(45) Date of Patent: Mar. 4, 2003

(54) CHEMICAL AMPLIFICATION TYPE NEGATIVE-WORKING RESIST COMPOSITION FOR ELECTRON BEAMS OR X-RAYS

(75) Inventor: Yutaka Adegawa, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/737,568

(22) Filed: Dec. 18, 2000

(65) Prior Publication Data

US 2001/0036590 A1 Nov. 1, 2001

(30) Foreign Application Priority Data

Dec. 16, 1999 (JP) .................................... 11-358022

(51) Int. Cl.⁷ ................................................. G03F 7/004
(52) U.S. Cl. ..................... 430/270.1; 430/296; 430/905
(58) Field of Search .......................... 430/296, 270.1, 430/905

(56) References Cited

U.S. PATENT DOCUMENTS

| 5,344,742 A | 9/1994 | Sinta et al. ................. 430/270 |
| 5,851,739 A | * 12/1998 | Oosedo et al. .............. 430/325 |
| 5,866,299 A | 2/1999 | Szmanda et al. |

FOREIGN PATENT DOCUMENTS

| EP | 0 823 659 A1 | 2/1998 | |
| EP | 0 874 282 A1 | 10/1998 | |
| JP | 2-52348 | 2/1990 | ........... G03F/7/004 |
| JP | 2-150848 | 6/1990 | ........... G03F/7/095 |
| JP | 3-87746 | 4/1991 | ........... G03F/7/023 |
| JP | 4-210960 | 8/1992 | ......... C07C/381/14 |
| JP | 4-217249 | 8/1992 | ........... G03F/7/004 |
| JP | 4-226454 | 8/1992 | ........... G03F/7/004 |
| JP | 4-291259 | 10/1992 | ......... G03F/7/0038 |
| JP | 4-367864 | 12/1992 | ........... G03F/7/029 |
| JP | 4-367865 | 12/1992 | ........... G03F/7/029 |
| JP | 6-67431 | 3/1994 | ......... G03F/7/038 |
| JP | 6-199770 | 7/1994 | ......... C07C/305/22 |
| JP | 6-236024 | 8/1994 | ........... G03F/7/004 |
| JP | 7-311463 | 11/1995 | ......... G03F/7/038 |
| JP | 2505033 | 4/1996 | ......... G03F/7/038 |
| JP | 8-152717 | 6/1996 | ......... G03F/7/038 |
| JP | 8-292559 | 11/1996 | ........... G03F/7/004 |
| JP | 10-10733 | 1/1998 | ......... G03F/7/038 |

* cited by examiner

Primary Examiner—Rosemary Ashton
(74) Attorney, Agent, or Firm—Sughrue Mion, PLLC

(57) ABSTRACT

A negative-working chemical amplification-type resist composition for electron beams or X-rays satisfying the characteristics of the sensitivity and resolution•resist pattern for the use of electron beams or X-rays is provided. The chemical amplification-type negative-working resist composition contains (1) an alkali-soluble resin having a weight-average molecular weight of exceeding 3,000 and not larger than 1,000,000, (2) a crosslinking agent causing crosslinkage by an acid, and (3) a compound generating an acid by the irradiation of electron beams or X-rays, wherein the alkali-soluble resin has a specific structure.

10 Claims, No Drawings

CHEMICAL AMPLIFICATION TYPE NEGATIVE-WORKING RESIST COMPOSITION FOR ELECTRON BEAMS OR X-RAYS

FIELD OF THE INVENTION

The present invention relates to a negative-working resist composition suitably used for a super micro lithographic process for producing VLSI and high-capacity microchips and other photofabrication processes. More specifically, the invention relates to a negative-working photoresist composition capable of forming highly fined patterns using X-rays, electron beams, etc., including an excimer laser light and particularly to a negative-working resist composition suitably used for very fine working of semiconductor devices using high energy rays such as electron beams, X-rays, etc.

BACKGROUND OF THE INVENTION

The integration degree of integration circuits has been more and more increased and in the production of a semiconductor substrate such as VLSI, etc., working of very fine patterns made of line width of a half micron or finer has become required. For satisfying the requirement, the using wavelength of a light exposure apparatus used for a photolithography becomes shorter and shorter and at present the use of a far-ultraviolet light and an excimer laser light (XeCl, KrF, ArF, etc.) has been investigated. Furthermore, the formation of finer patters by electron beams or X-rays has been investigated.

Particularly, electron beams or X-rays are positioned as the pattern forming technique of the next generation or further and the development of a negative-working resist capable of attaining a high-sensitive, high-resolving, and rectangular profile form has been desired.

In an electron ray lithography, a resist material is light-exposed to an energy released in the stage that accelerated electron beams are collided with the atoms constituting the resist material and cause scattering. By using highly accelerated electron beams, the straight-going property is increased, the influence of electron scattering is reduced, and the formation of patterns of a high-resolution and a rectangular form becomes possible but on the other hand, the permeability of electron beams is increased and the sensitivity is lowered. As described above, in the electron ray lithography, the sensitivity and the resolution•resist pattern are in the relation of trade off, and it was a problem to obtain both the properties together.

Also, an X-ray lithography has the same problem as above.

Hitherto, for chemical amplification type negative-working resist, various alkali-soluble resins have been proposed. For example, JP-A-8-152717 (the term "JP-A" as used herein means an "unexamined published Japanese patent application") discloses partially alkyletherificated polyvinyl phenol, JP-A-6-67431 and JP-A-10-10733 disclose a copolymer of vinyl phenol and styrene, Japanese Patent 2505033 discloses a novolac resin, and JP-A-7-311463 and JP-A-8-292559 disclose monodispersed polyvinyl phenol, but by these alkali-soluble resins, both the characteristics of the sensitivity and the resolution•resist pattern are not obtained together under the irradiation of electron beams or X-rays.

Also, hitherto, for the chemical amplification type negative-working resist, various compounds generating an acid by electron beams or X-rays are proposed. For example, JP-B-8-3635 (the term "JP-B" as used herein means an "examined Japanese patent publication") discloses organic halogen compounds, JP-A-2-150848 and JP-A-6-199770 disclose iodonium salts and sulfonium salts, JP-A-2-52348, JP-A-4-367864, and JP-A-4-367865 disclose acid-generating agents containing Cl or Br, JP-A-4-210960 and JP-A-4-217249 disclose diazodisulfone compounds and diazosulfone compounds, JP-A-4-226454 discloses triazine compounds, and JP-A-3-87746, JP-A-4-291259, and JP-A-6-236024 and U.S. Pat. No. 5,344,742 disclose sulfonate compounds, but by these acid-generating agents, the trade off of the sensitivity and the resolution•resist pattern under the irradiation of electron beams or X-rays could not be overcome.

Furthermore, about a crosslinking agent, methylolmelamine, resole resins, epoxydated novolac resins, urea resins, etc., have hitherto been used, but these crosslinking agents are unstable to heat, there is a problem in the storage stability in the case of forming a resist liquid, and further they cannot satisfy the required characteristics of the sensitivity and high-resolution and rectangular resist pattern under the irradiation of electron beams or X-rays.

SUMMARY OF THE INVENTION

Accordingly, the present invention has been made for solving the problems on the technique of improving the performance essential to the microfabrication using electron beams or X-rays and provides a negative-working chemical amplification type resist composition for electron beams or X-rays satisfying the characteristics of the sensitivity and the resolution•resist pattern for the use of electron beams or X-rays.

The problem described above has been attained by the following invention.

1. A chemical amplification type negative-working resist composition for electron beams or X-rays comprising
   (1) an alkali-soluble resin having a weight-average molecular weight of exceeding 3,000 and not larger than 1,000,000.
   (2) a crosslinking agent causing crosslinkage with an acid, and
   (3) a compound generating an acid by the irradiation of electron beams or X-rays, wherein
   the alkali-soluble resin satisfies following conditions (a) and (b);
   (a) the resin has at least one repeating unit induced from a monomer having an aromatic ring having 6 or more and 20 or less carbon atoms and an ethylenically unsaturated group bonded to the aromatic ring directly or via a linkage group, and
   (b) between the π electrons of the aromatic ring and the number of electrons of the unshared electron pair of a substituent on the aromatic ring, the following relation exists;

$$N\pi + \tfrac{1}{2} N_{lone} \geq 10 \qquad \text{(Equation 1)}$$

wherein $N\pi$ represents a total number of π electrons and $N_{lone}$ represents a total number of electrons of the unshared electric pair of a straight chain, branched, or cyclic alkoxy group, alkenyloxy group, aryloxy group, or aralkyloxy group having from 1 to 12 carbon atoms, or a hydroxyl group as the substituent, and adjacent two groups of two or more alkoxy groups or hydroxyl groups may combine with each other to form a ring structure of a 5-membered or higher-membered ring.

2. The chemical amplification type negative-working resist composition for electron beams or X-rays described in the above-described item 1, wherein the alkali-soluble resin has at least one repeating unit represented by the following formulae (1) to (5) as the constituting component;

(1)

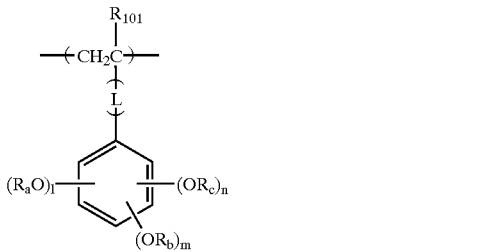

(2)

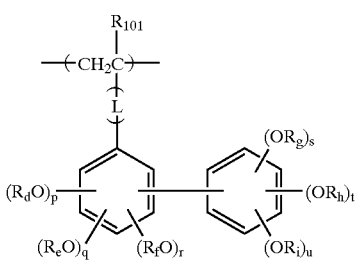

(3)

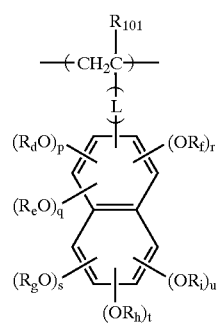

(4)

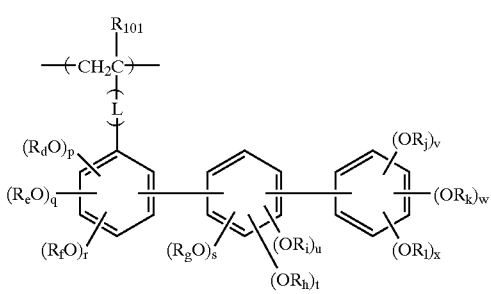

(5)

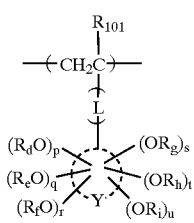

wherein $\overset{\cdot\cdot\cdot}{Y}$ represents

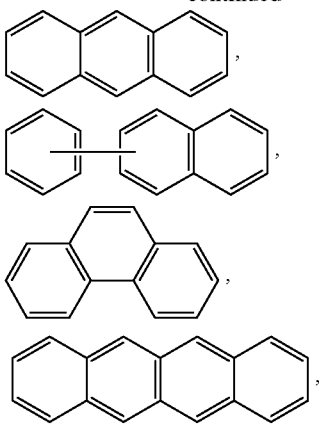

wherein, $R_{101}$ represents a hydrogen atom or a methyl group; L represents a divalent linkage group; Ra, Rb, Rc, Rd, Re, Rf, Rg, Rh, Ri, Rj, Rk, and Rl each independently represents a straight chain, branched, or cyclic alkyl group, alkcenyl group, aryl group, or aralkyl group having from 1 to 12 carbon atoms, or a hydrogen atom, also they may combine with each other to form a ring of 5 members or higher having not more than 24 carbon atoms; l, m, n, p, q, r, s, t, u, v, w, and x each represents an integer of from 0 to 3, and satisfy l+m+n=2 or 3, p+q+r=0, 1, 2, or 3, s+t+u=0, 1, 2, or 3, and v+w+x=0, 1, 2, or 3.

3. The chemical amplification type negative-working resist composition for electron beams or X-rays described in the above-described item 1 or 2, wherein the crosslinking agent causing crosslinkage with an acid is a phenol derivative having from 1 to 6 benzene rings in the molecule, has a molecular weight of not larger than 1500, and has at least two hydroxymethyl groups and/or alkoxymethyl groups in the whole molecule, which is bonded to at least one of benzene ring atomic groups.

4. The chemical amplification type negative-working resist composition for electron beams or X-rays described in any one of the above-described items 1 to 3, wherein the molecular weight distribution of the alkali-soluble resin is from 1.0 to 1.5.

5. The chemical amplification type negative-working resist composition for electron beams or X-rays described in any one of the above-described items 1 to 4, wherein the compound generating an acid by electron beams or X-rays is the compound represented in following formulae (I) to (III);

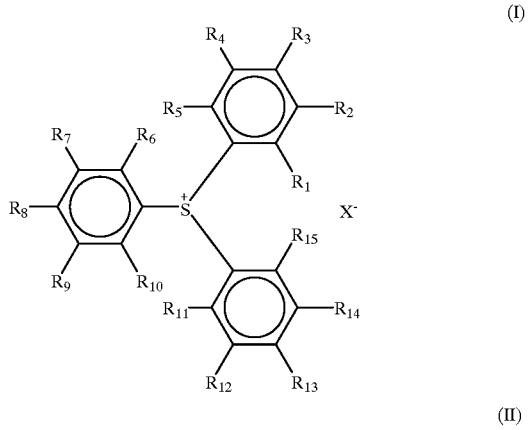

(I)

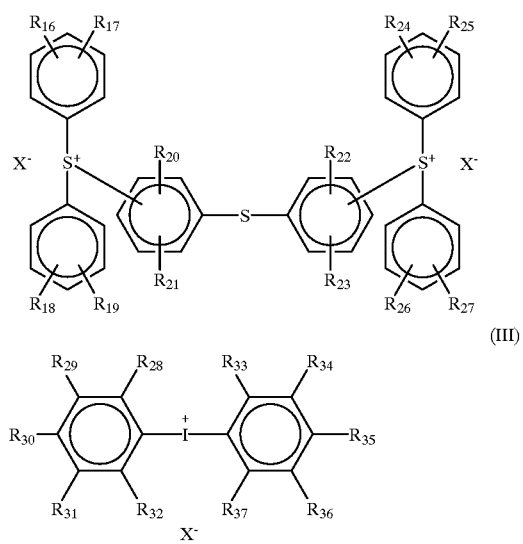

(II)

(III)

wherein, $R_1$ to $R_{37}$, which may be the same or different, each represents a hydrogen atom, a straight chain, branched, or cyclic alkyl group, a straight chain, branched, or cyclic alkoxy group, a hydroxyl group, a halogen atom, or a —S—$R_{38}$ group, wherein $R_{38}$ represents a straight chain, branched, or cyclic alkyl group or an aryl group; and at least two of $R_1$ to $R_{15}$, $R_{16}$ to $R_{27}$, or $R_{28}$ to $R_{37}$ may combine with each other to form a ring containing one kind or at least two kinds selected from a single bond, carbon, oxygen, sulfur, and nitrogen; and $X^-$ represents the anion of benzenesulfonic acid, naphthalenesulfonic acid, or anthracenesulfonic acid having at least one kind selected from at least one fluorine atom, a straight chain, branched, or cyclic alkyl group substituted by at least one fluorine atom, a straight chain, branched, or cyclic alkoxy group substituted by at least one fluorine atom, an acyl group substituted by at least one fluorine atom, an acyloxy group substituted by at least one fluorine atom, a sulfonyl group substituted by at least one fluorine atom, a sulfonyloxy group substituted by at least one fluorine atom, a sulfonylamino group substituted by at least one fluorine atom, an aryl group substituted by at least one fluorine atom, an aralkyl group substituted by at least one fluorine atom, and an alkoxycarbonyl group substituted by at least one fluorine atom.

6. The chemical amplification type negative-working resist composition for electron beams or X-rays described in any one of the above-described items 1 to 5, wherein the composition further contains a surface active agent containing fluorine and/or silicon.

7. The chemical amplification type negative-working resist composition for electron beams or X-rays described in any one of the above-described items 1 to 6, wherein the composition contains propylene glycol monomethyl ether acetate as a solvent.

DETAILED DESCRIPTION OF THE INVENTION

Then, the compounds constituting "the chemical amplification type negative-working resist composition for electron beams or X-rays" (hereinafter, is sometimes referred to as simply "the negative-working resist composition") of the present invention is explained.

(I) Alkali-Soluble Resin:

The alkali-soluble resin is a resin which is insoluble in water and soluble in an aqueous alkali solution (hereinafter, it referred to the alkali-soluble resin). The dissolving rate of the alkali-soluble resin is preferably at least 20 Å/second, and particularly preferably at least 200 Å/second measured (23° C.) with 0.261N tetramethylammonium hydroxide (TMAH).

The alkali-soluble resin used in the invention further satisfies the following conditions (a) and (b).

(a) The resin has at least one repeating unit induced from a monomer having an aromatic ring having from 6 to 20 carbon atoms and an ethylenically unsaturated group bonded to the aromatic ring directly or via a linkage group.

(b) Between the π electrons of the aromatic ring and the number of electrons of the unshared electron pair of a substituent on the aromatic ring, the relation of the equation (I) exists.

$$N\pi + \tfrac{1}{2} N_{lone} \geq 10 \qquad (I)$$

In the equation (I), Nπ represents a total number of π electrons and $N_{lone}$ represents a total number of electrons of the unshared electric pair of a straight chain, branched, or cyclic alkoxy group, alkenyloxy group, aryloxy group, or aralkyloxy group having from 1 to 12 carbon atoms, or a hydroxyl group as the substituent. Adjacent two groups of two or more alkoxy groups or hydroxyl groups may combine with each other to form a ring structure of a 5-membered or higher-membered ring.

In particular, it is preferred that $N\pi+(\frac{1}{2}) N_{lone}$ in the equation (I) is in the range of from 10 to 40 for the structure of easily generating secondary electrons. As the preferred aromatic ring, there can be illustrated a benzene ring, a naphthalene ring, an anthracene ring, phenanthracene ring, a biphenyl ring, etc., and as the preferred substituent on the aromatic ring, there are a hydroxyl group, a methoxy group, an ethoxy group, an isopropyl group, etc.

Also, when the aromatic group has the total number $N\pi$ of the $\pi$ electrons is at least 10 (for example, a naphthalene ring, an anthracene ring, a phenanthrene ring, or an aromatic ring such as biphenyl), the substituent on the aromatic ring may be a group having no unshared electric pair (the group of $N_{lone}=0$), and there are, for example, a hydrogen atom and a saturated alkyl group.

More practically, it is preferred that the alkali-soluble resin in the invention has the repeating unit shown by the formula (1) to (5) as the constituting component.

In formulae (1) to (5), $R_{101}$ represents a hydrogen atom or a methyl group. L represents a divalent linkage group. Ra, Rb, Rc, Rd, Re, Rf, Rg, Rh, Ri, Rj, Rk, and Rl each independently represents a straight chain, branched, or cyclic alkyl group, alkenyl group, aryl group, or aralkyl group having from 1 to 12 carbon atoms, or a hydrogen atom. Also they may combine with each other to form a ring of at least 5 members having not more than 24 carbon atoms. Symbols l, m, n, p, q, r, s, t, u, v, w, and x each represents an integer of from 0 to 3, and satisfy l+m+n=2 or 3, p+q+r=0, 1, 2, or 3, s+t+u=0, 1, 2, or 3, and v+w+x=0, 1, 2, or 3.

As the examples of Ra, Rb, and Rc, there are hydrogen, a methyl group, an ethyl group, a propyl group, an isopropyl group, a butyl group, an isobutyl group, a t-butyl group, a pentyl group, a neopentyl group, a hexyl group, a cyclohexyl group, an octyl group, a decyl group, a dodecyl group, an allyl group, a benzyl group, a phenyl group, a cumyl group, etc. Also, there are illustrated the groups which are combined with each other to form a methyl-substituted dioxole ring, an ethyl-substituted dioxole ring, a phenyl-substituted dioxole ring, a dimethyl-substituted dioxole ring, or a dioxane ring.

As examples of Ra, Rb, Rc, Rd, Re, Rf, Rg, Rh, Ri, Rj, Rk, and Rl, there are hydrogen, a methyl group, an ethyl group, a propyl group, an isopropyl group, a butyl group, an isobutyl group, a t-butyl group, a pentyl group, a neopentyl group, a hexyl group, a cyclohexyl group, an octyl group, a decyl group, a dodecyl group, an allyl group, a benzyl group, a phenyl group, a cumyl group, etc. As examples of Rd to Rf, Rg to Ri, or Rj to Rl, there are also illustrated groups forming a dioxole ring, a methyl-substituted dioxole ring, an ethyl-substituted dioxole ring, a phenyl-substituted dioxole ring, a dimethyl-substituted dioxole ring, or a dioxane ring.

As examples of L, there are a single bond, —CH$_2$—, —COO—, —COOCH$_2$—, —OCH$_2$CH$_2$O—, —OCH$_2$—, —CONH—, etc.

In each aromatic ring shown by Y, the position of the bonding hand bonded to the main chain or the bonding hand bonding to the substituent may be any position on the aromatic ring.

Preferred practical examples of these structures are shown below but the invention is not limited to them.

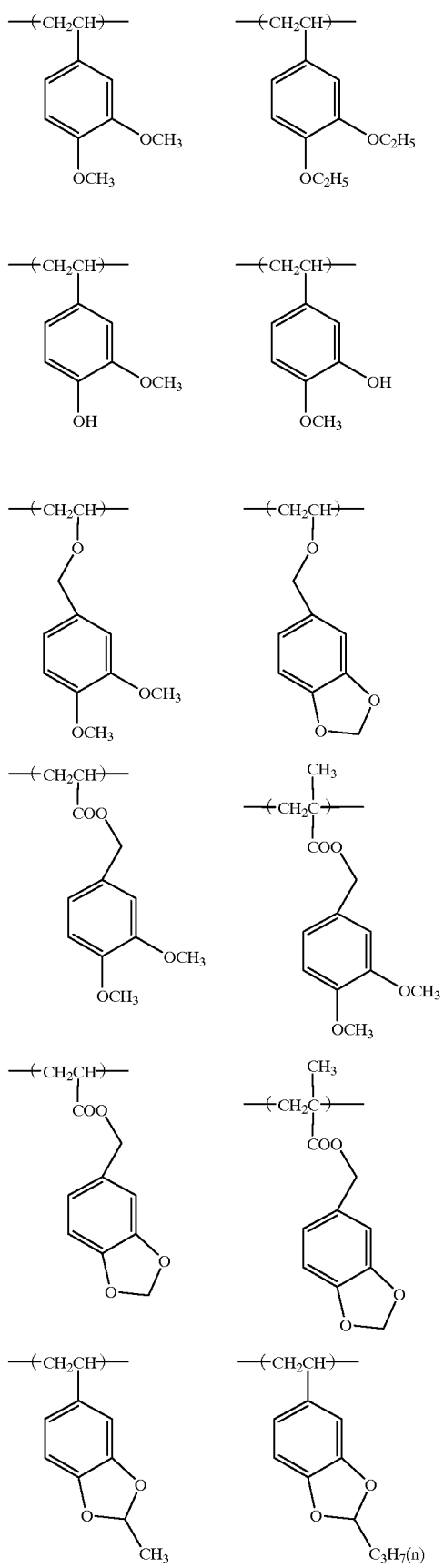

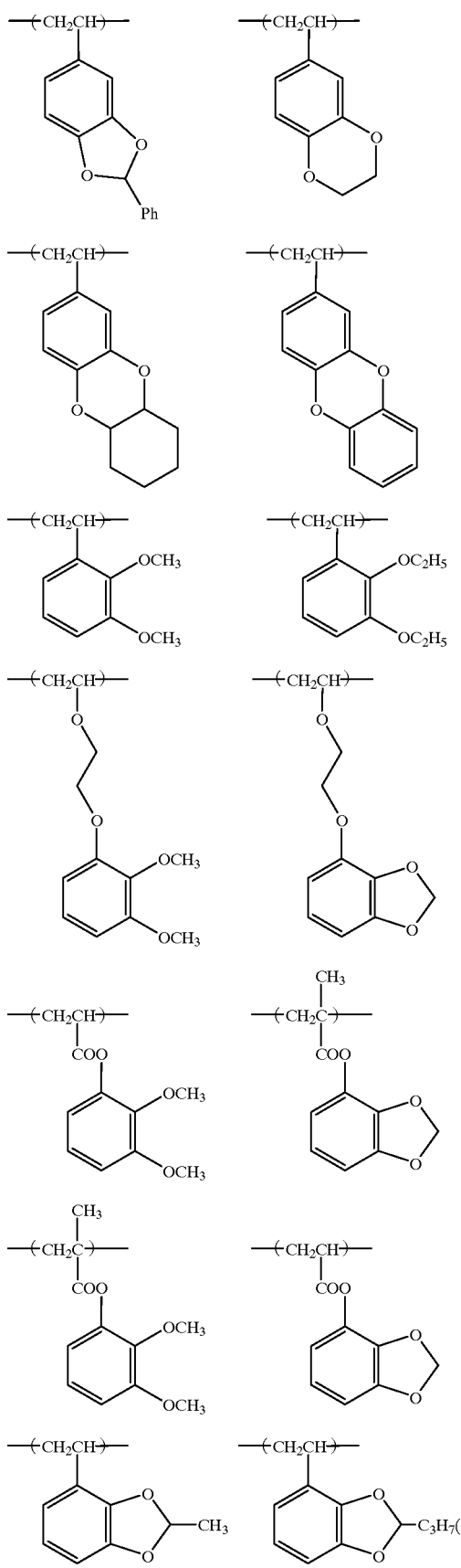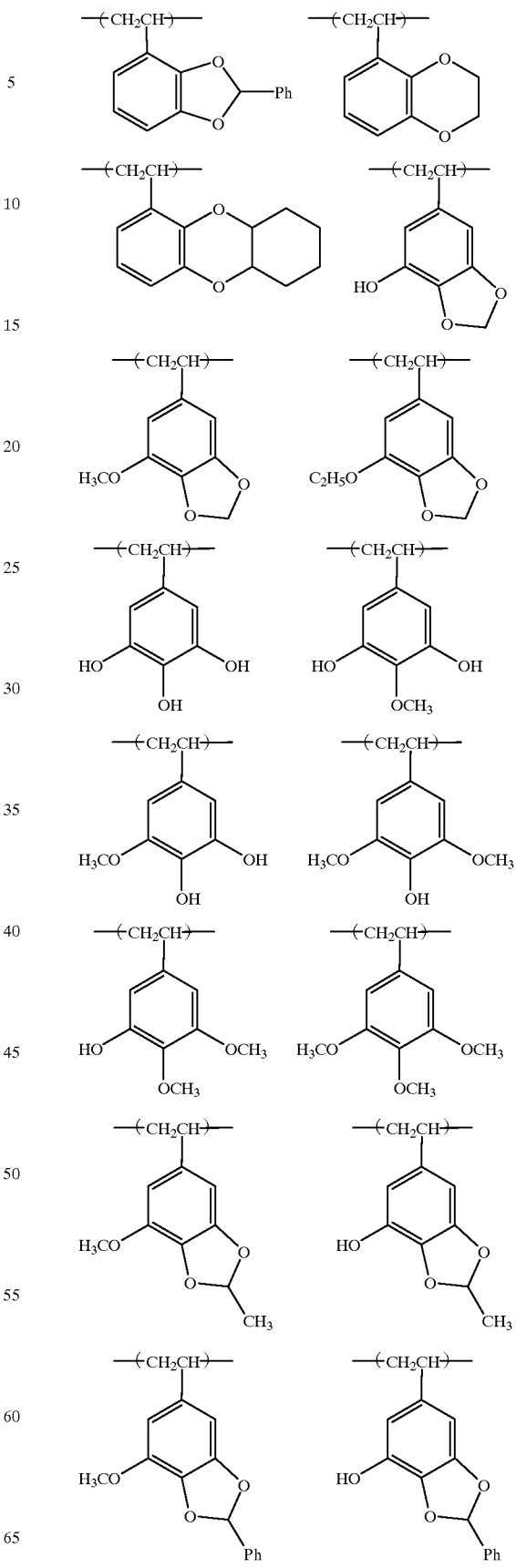

-continued
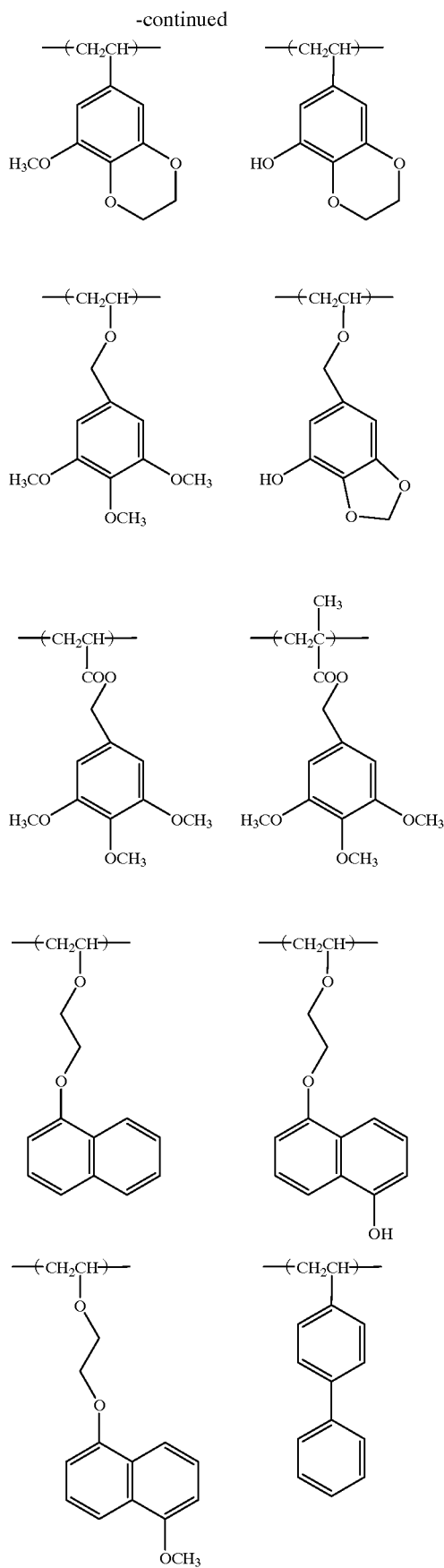
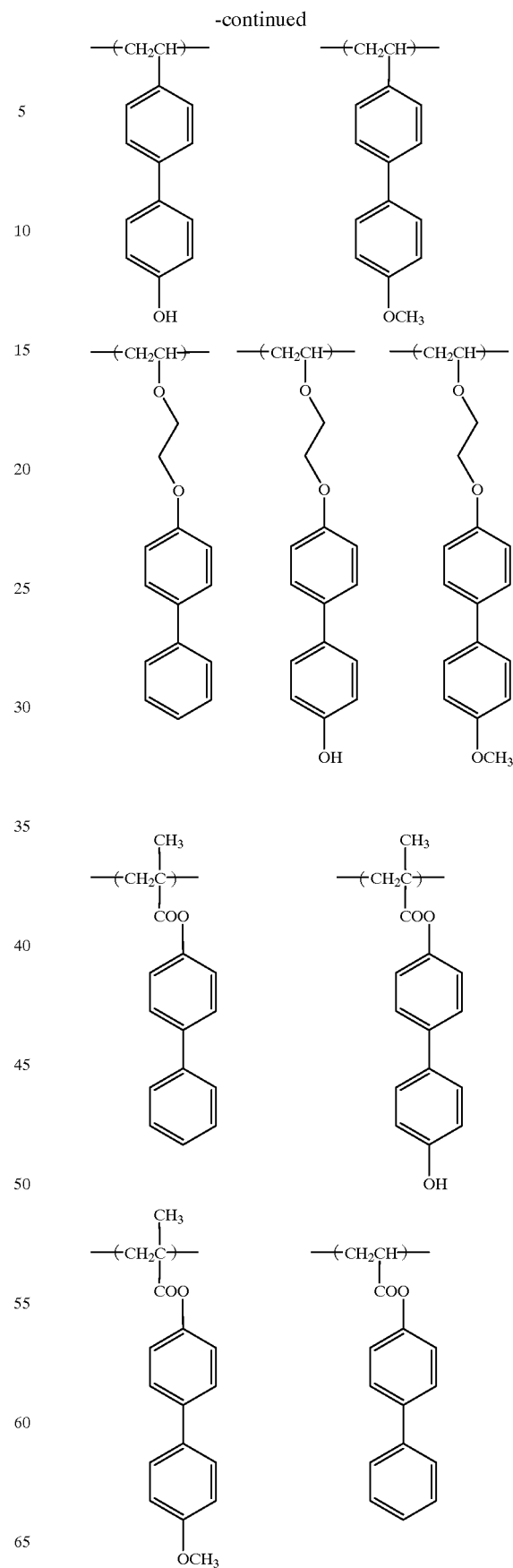

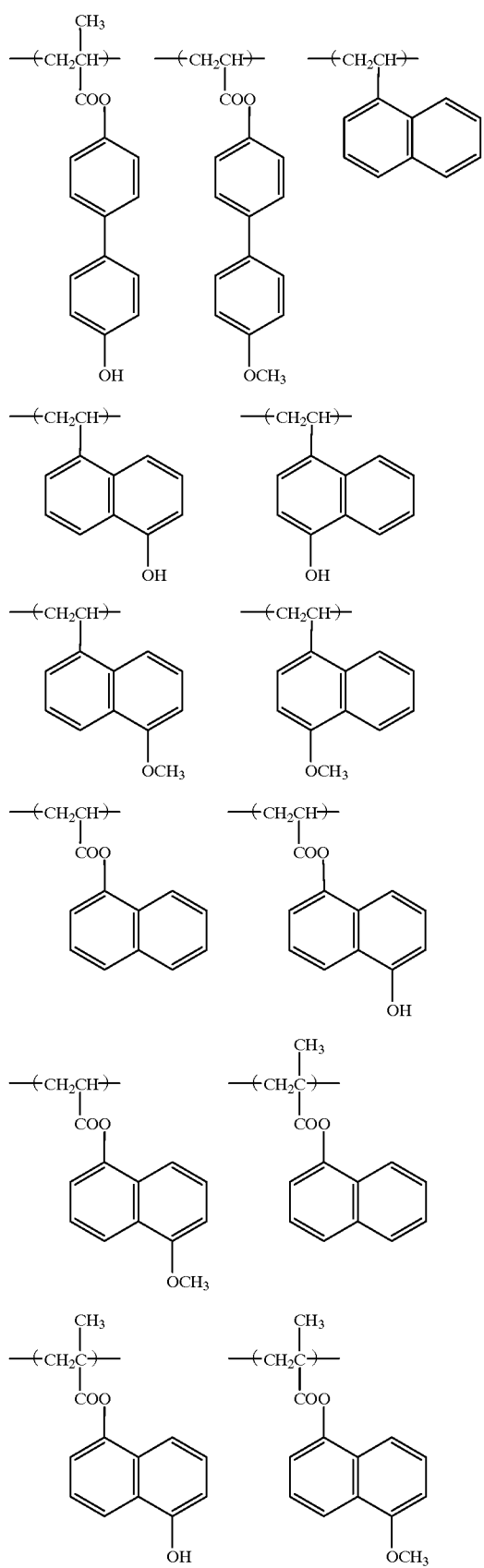
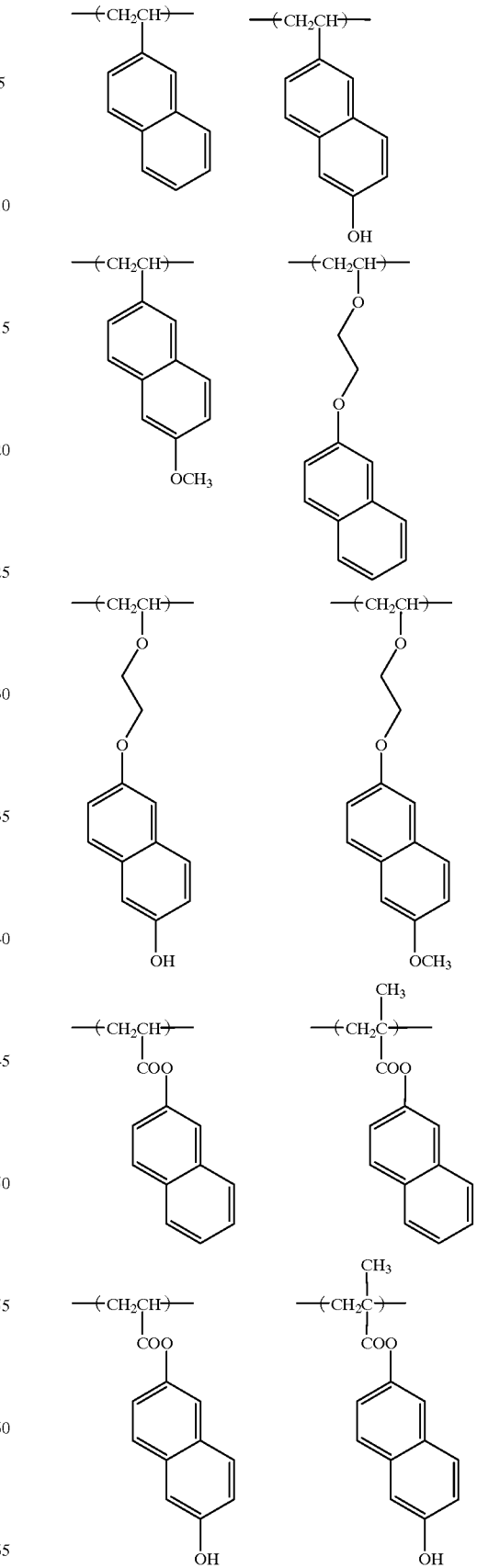

-continued
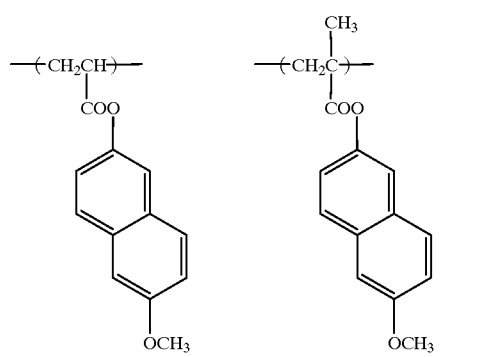
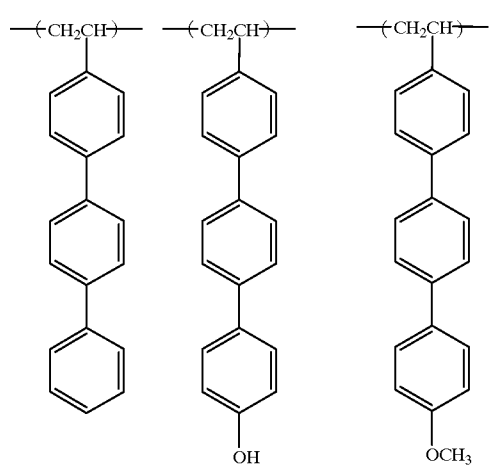
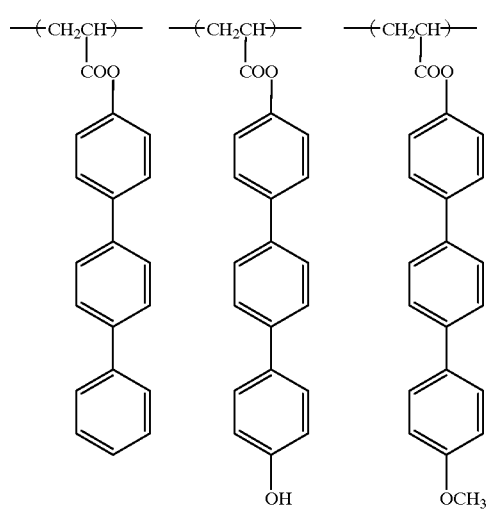
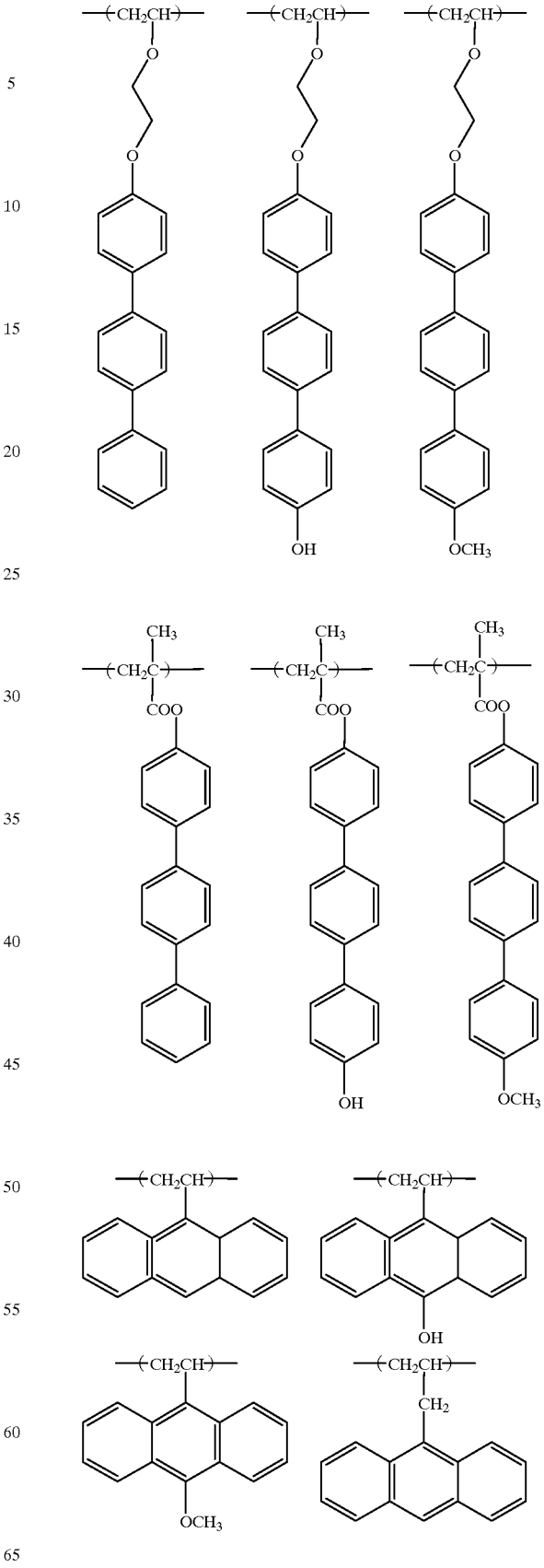

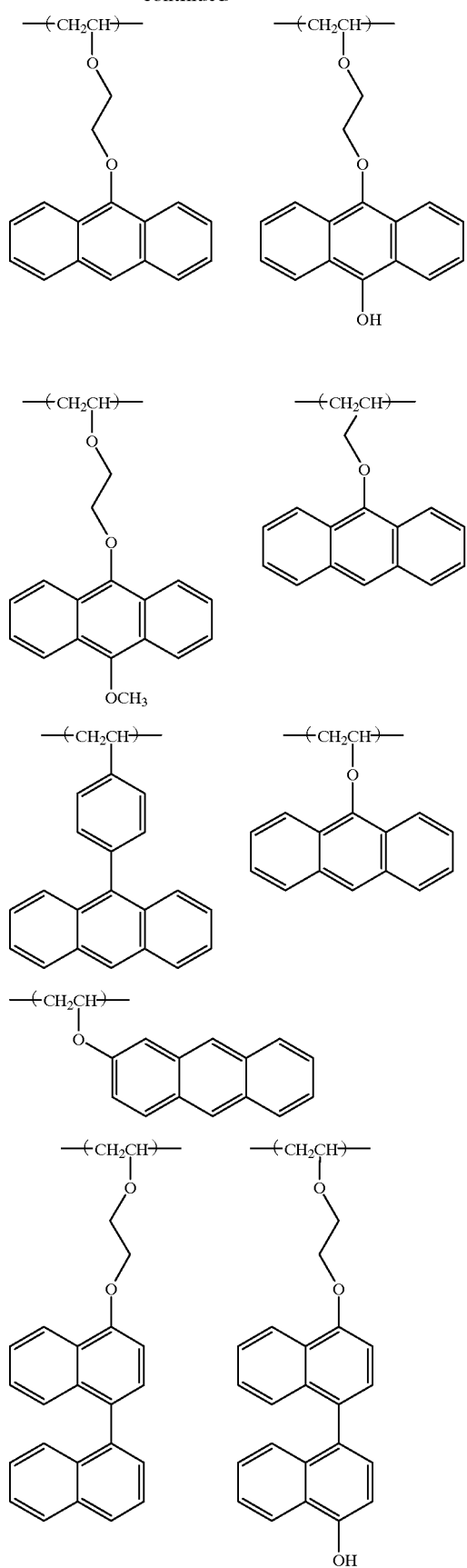
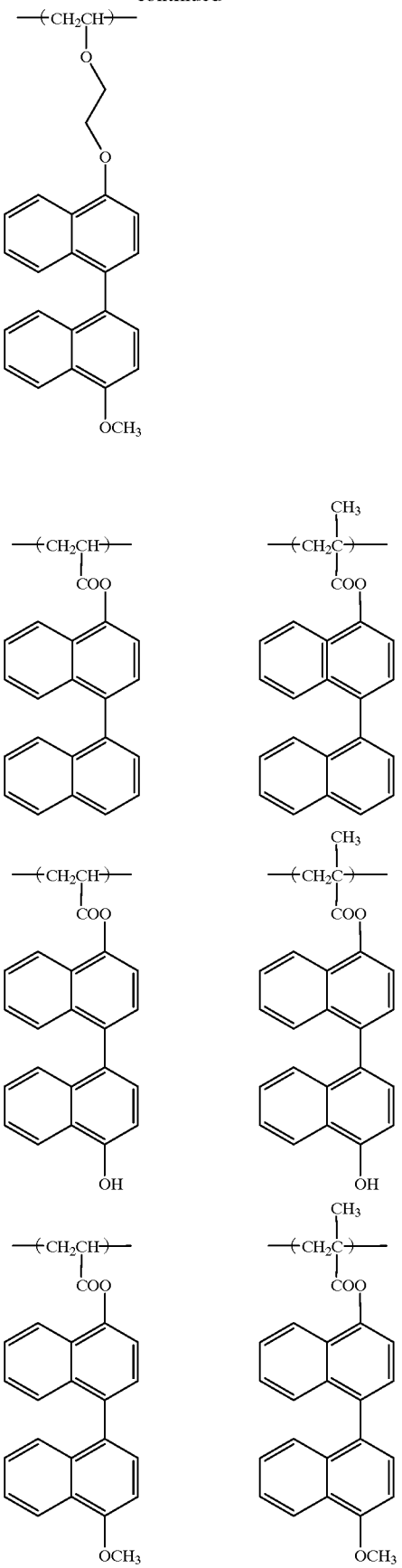

-continued

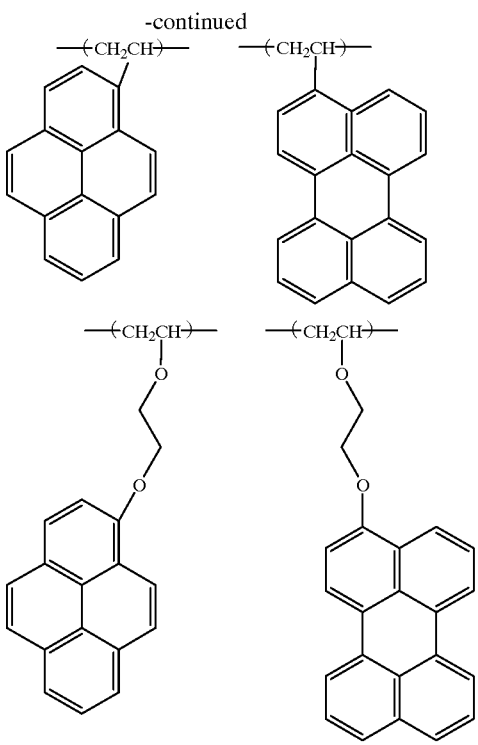

The alkali-soluble resin in the invention can be synthesized by a known method such as a radical polymerization, a cationic polymerization, an anionic polymerization, etc. It is most convenient to carry out a radical polymerization by combining corresponding monomers but according to the monomers, they can be more suitably synthesized by utilizing a cationic polymerization or an anionic polymerization. Also, when a monomer causes other reaction than polymerization according to the species of a polymerization initiator, the monomer introduced with a proper protective group is polymerized and after polymerization, by removing the protective group, a desired polymer can be obtained. Also, about a polymer having an alkoxy group, by subjecting the hydroxy group of a polymer having a corresponding hydroxyl group to etherification reaction, a desired polymer can be obtained. These polymerization methods are described in "Jikken Kagaku Koza 28 Koobunshi Gosei (Experimental Chemistry Course 28 Polymer Synthesis)", "Shin Jikken Kagaku Koza 19 Koobunshi Kagaku (New Experimental Chemistry Course 19 Polymer Chemistry) [I]", etc.

Also, the weight-average molecular weight of the alkali-soluble resin in the invention exceeds 3,000 but is not larger than 1,000,000. Furthermore, the weight-average molecular weight thereof preferably exceeds 3,000 and not larger than 500,000, and more preferably exceeds 3,000 and not larger than 100,000.

The molecular weight distribution (Mw/Mn) of the alkali-soluble resin which can be synthesized by the above-described synthetic method is preferably from 1.0 to 1.5, whereby the sensitivity of the resist can be particularly increased. In addition, the alkali-soluble resin having such a molecular weight distribution can be synthesized by utilizing a living anionic polymerization in the above-described synthetic method.

Also, in the invention, the alkali-soluble resin may be used together with other alkali-soluble resin.

As other alkali-soluble resin which can be used in the invention, there are, for example, a novolac resin, a hydrogenated novolac resin, an acetone-pyrogallol resin, o-polyhydroxystyrene, m-polyhydroxystyrene, p-polyhydroxystyrene, hydrogenated polyhydroxystyrene, halogen- or alkyl-substituted polyhydroxystyrene, a hydroxystyrene-N-substituted maleimide copolymer, an o/p- and m/p-hydroxystyrene copolymer, a partial O-alkylated product to the hydroxyl group of polyhydroxystyrene [for example, a 5 to 30 mol % O-methylated product, O-(1-methoxy)ethylated product, O-(1-ethoxy)ethylated product, O-2-tetrahydropyranylated product, and O-(t-butoxycarbonyl)methylated product] or O-acylated product [for example, a 5 to 30 mol % o-acetylated product and O-(t-butoxy)carlbonylated product], a styrene-maleic anhydride copolymer, a styrene-hydroxystyrene copolymer, an α-methylstyrene-hydroxystyrene copolymer, a carboxyl group-containing methacrylic resin and the derivatives thereof, although the invention is not limited to these compounds.

Particularly preferred other alkali-soluble resins are a novolac resin, o-polyhydroxystyrene, M-polyhydroxystyrene, p-polyhydroxystyrene and the copolymers of them, alkyl-substituted polyhydroxystyrene, a partial O-alkylated product or O-acylated product of polyhydroxystyrene, a styrene-hydroxystyrene copolymer, and an α-methylstyrene-hydroxystyrene copolymer. The novolac resin described above can be obtained by addition condensing the definite monomer described below as the main constituent and an aldehyde in the presence of an acidic catalyst.

As the definite monomer, cresols such as phenol, m-cresol, p-cresol, o-cresol, etc.; xylenols such as 2,5-xylenol, 3,5-xylenol, 3,4-xylenol, 2,3-xylenol, etc.; alkylphenols such as m-ethylphenol, p-ethylphenol, o-ethylphencol, p-t-butylphenol, p-octylphenol, 2,3,5-trimethylphenol, etc.; alkoxyphenols such as p-methoxyphenol, m-methoxyphenol, 3,5-dimethoxyphenol, 2-methoxy-4-methylphenol, m-ethoxyphenol, p-ethoxyphenol, m-propoxyphenol, p-propoxyphenol, m-butoxyphenol, p-butoxyphenol, etc.; bisalkylphenols such as 2-methyl-4-isopropylphenol, etc.; hydroxy aromatic compounds such as m-chlorophenol, p-chlorophenol, o-chlorophenol, dihydroxybiphenyl, bisphenol A, phenylphenol, resorcinol, naphthol, etc., can be used singly or as a mixture of two or more kinds, but the invention is not limited to these monomers.

As the aldehydes described above, for example, formaldehyde, para-formaldehyde, acetaldehyde, propionaldehyde, benzaldehyde, phenylacetaldehyde, α-phenylpropylaldehyde, β-phenylpropylaldehyde, o-hydroxybenxzaldehyde, m-hydroxyaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, furfural, chloroaldehyde and the acetal products of them such as, for example, chloroacetaldehyde diethylacetal, etc., can be used but the use of formaldehyde is preferred.

These aldehydes are used singly or as a combination of two or more kinds thereof. As the acidic catalyst, hydrochloric acid, sulfuric acid, formic acid, acetic acid, oxalic acid, etc., can be used.

The weight-average molecular weight of the novolac resin thus obtained is preferably in the range of from 1,000 to 30,000. When the average molecular weight is less than 1,000, film thickness loss of the light-exposed portions after development is large, while the molecular weight exceeds 30,000, the development speed is reduced. The particularly suitable weight-average molecular weight is in the range of from 2,000 to 20,000.

The weight-average molecular weight of the above-described polyhydroxystyrene and the derivatives thereof and copolymers other than the novolac resin is at least 2,000, preferably from 2,000 to 30,000, and more preferably from 2,000 to 20,000.

Now, the weight-average molecular weight is defined by the polystyrene-converted value of a gel permeation chromatography.

These alkali-soluble resins in the invention may be used as a mixture of two or more kinds thereof. The using amount of the alkali-soluble resins is usually from 30 to 90% by weight, and preferably from 50 to 80% by weight to the total weight (excluding solvent) of the resist composition as the standard.

The using amount of only the alkali-soluble resin, which is the characteristic component of the invention, is from 30 to 90% by weight, and preferably from 50 to 80% by weight to the total weight (excluding solvent) of the resist composition as the standard.

(2) Crosslinking Agent:

In the invention, as the compound causing crosslinkage with an acid (hereinafter, is referred as properly acid crosslinking agent, or simply crosslinking agent), phenol derivatives can be used. Preferably, there are phenol derivatives each having a molecular weight of not larger than 1500, having from 1 to 6 benzene rings in the molecule, and having further at least two hydroxymethyl group(s) and/or alkoxymethyl group(s) in such a manner that the hydroxymethyl group(s) and/or the alkoxymethyl group(s) are concentrated to at least one of the benzene rings in the molecule or are separately bonded to the benzene rings.

As the alkoxymethyl group bonded to the benzene ring is preferably the alkoxymethyl group having not more than 6 carbon atoms. Practically, a methoxymethyl group, an ethoxymethyl group, an n-propoxymethyl group, an i-propoxymethyl group, a n-butoxymethyl group, an i-butoxymethyl group, a sec-butoxymethyl group, and a t-butoxymethyl group are preferred. Furthermore, alkoxy groups substituted by an alkoxy group, such as a 2-methoxyethoxy group and a 2-methoxy-1-propyl group are also preferred. In these phenol derivatives, particularly preferred ones are shown below.

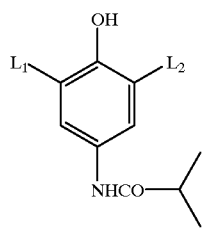

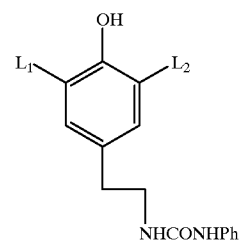

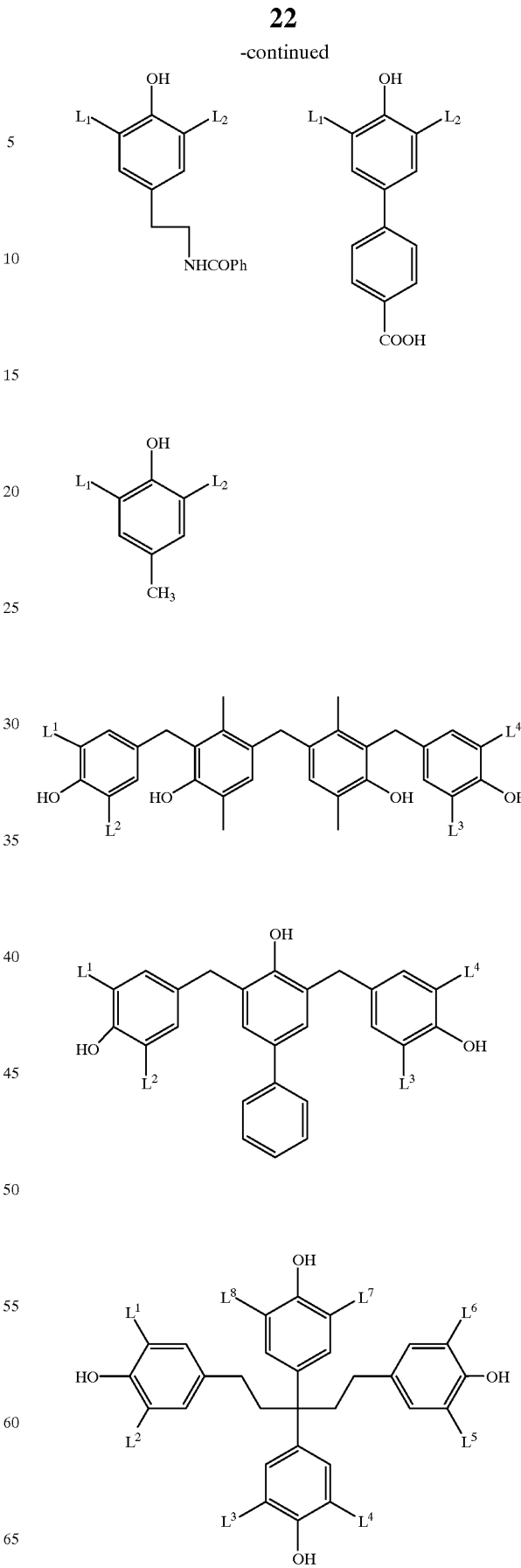

-continued
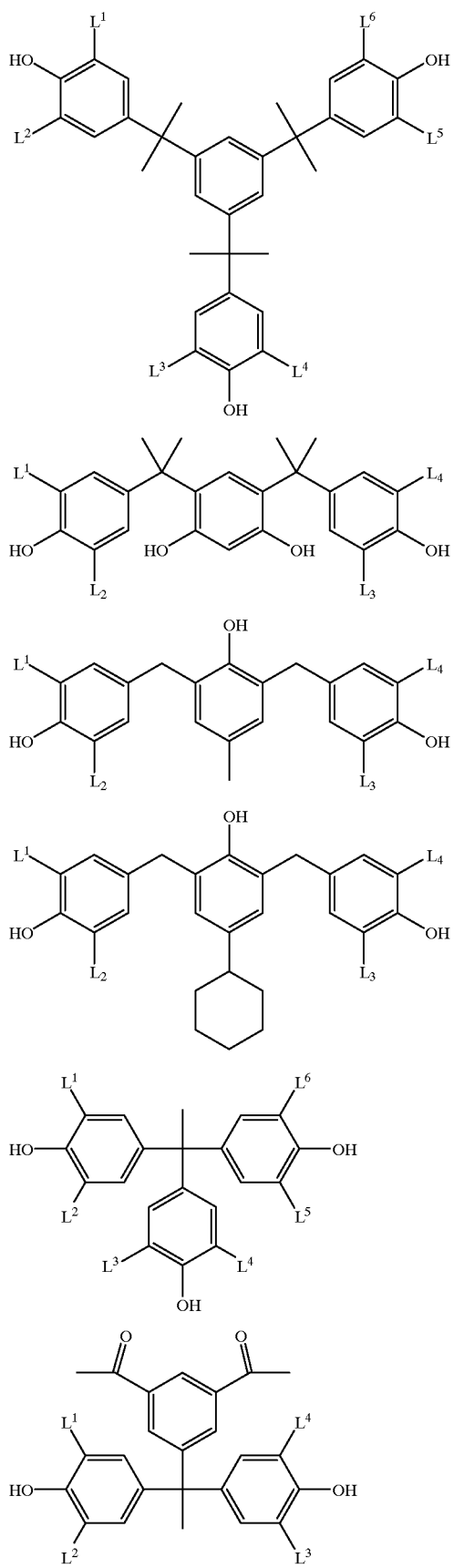
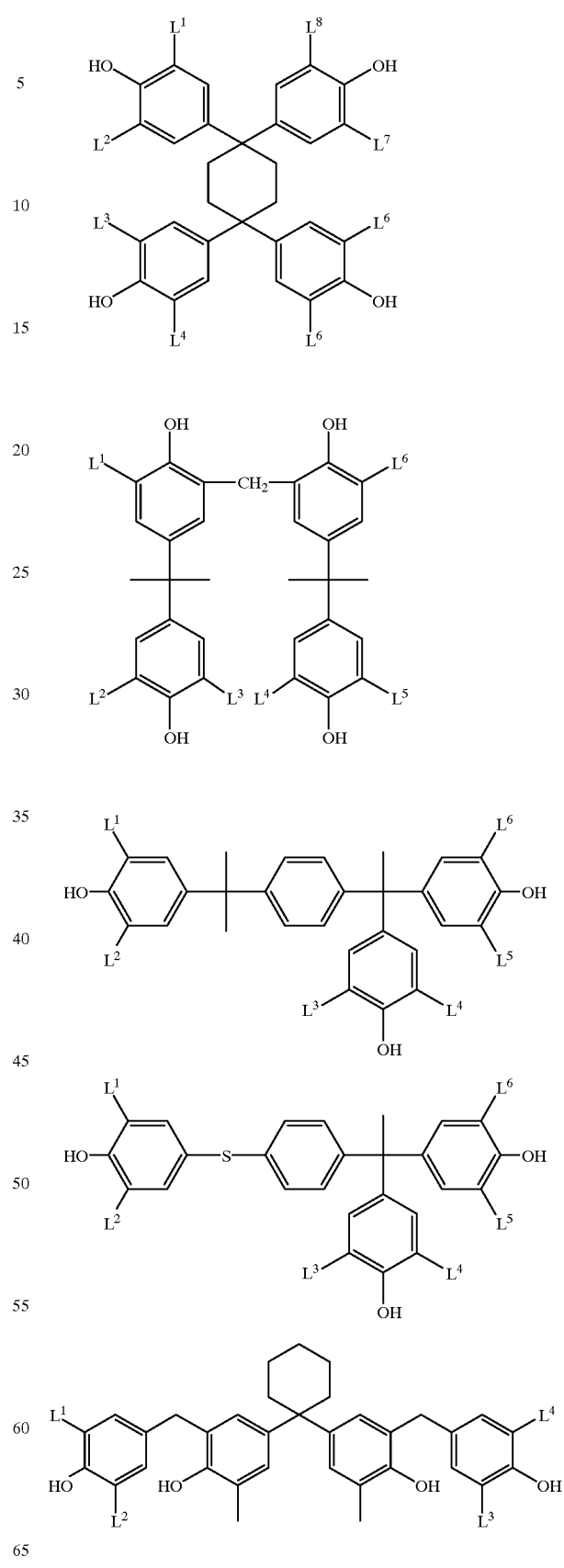

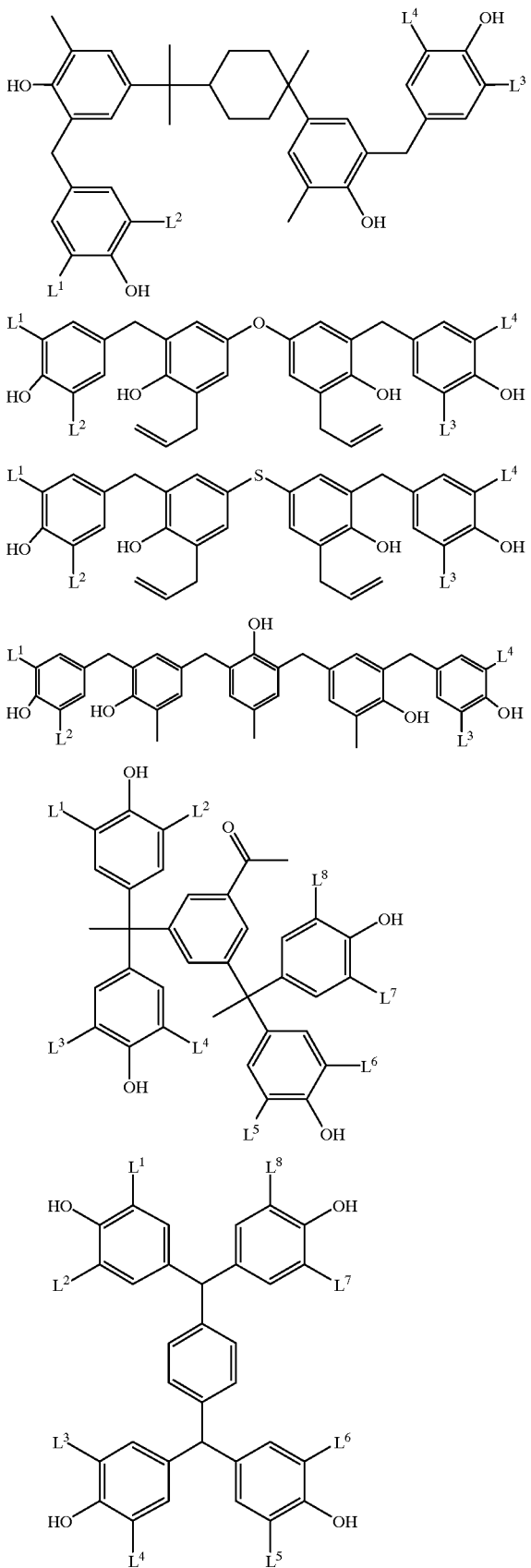

(In the formulae, $L^1$ to $L^8$, which may be the same or different, each represents a hydroxymethyl group, a methoxymethyl group, or an ethoxymethyl group.)

The phenol derivatives each having a hydroxymethyl group can be obtained by reacting phenol compounds without having the corresponding hydroxymethyl group (the compounds shown by the above-described formulae, wherein $L^1$ to $L^8$ each is a hydrogen atom) and formaldehyde under the present of a basic catalyst. In this case, for preventing that the reaction product becomes a resin or a gel, it is preferred that the reaction is carried out at a reaction temperature of not higher than 60° C. Practically, the compounds can be synthesized by the methods described in JP-A-6-282067, JP-A-7-64285, etc.

The phenol derivatives each having an alkoxymethyl group can be obtained by reacting phenol derivatives having the corresponding hydroxymethyl group and alcohols under the present of an acid catalyst. In this case, for preventing that the reaction product becomes a resin or a gel, it is preferred that the reaction is carried out at a reaction temperature of not higher than 100° C. Specifically, the compounds can be synthesized by the methods described in European Patent EP 632003A1, etc.

The phenol derivatives each having a hydroxy methyl group or an alkoxymethyl group thus synthesized are preferable in the point of the stability at storage and the phenol derivatives each having an alkoxymethyl group are particularly preferable in the view point of the stability at storage. The phenol derivatives each having at least two hydroxymethyl groups or alkoxymethyl groups in such a manner that the groups are concentrated to one of the benzene rings or are separately bonded to each benzene ring may be used singly or as a combination of two or more kinds thereof.

Such a phenol derivative is used in an addition amount of from 3 to 70% by weight, and preferably from 5 to 50% by weight to the total solid components of the resist composition. When the addition amount of the phenol derivative as the crosslinking agent is less than 3% by weight, the residual film ratio is lowered and also when the addition amount exceeds 70% by weight, the resolving power is lowered and further it is undesirable in the point of the stability at storing the resist liquid.

In the invention, other crosslinking agents (i) and (ii) shown below can be used but it is preferred to use the crosslinking agent together with the above-described crosslinking agent. In this case, the molar ratio of the above-described crosslinking agent in the invention to other crosslinking agent shown below is from 100/0 to 20/80, preferably from 90/10 to 40/60, and more preferably from 80/20 to 50/50.

The amount of all the crosslinking agents which can be used in the invention is in the range of from 2 to 80% by weight, preferably from 5 to 75% by weight, and particularly preferably from 10 to 70% by weight to the total solid components. When the addition amount of the crosslinking agents is less than 2% by weight, film thickness loss at development is large, and also, when the addition amount exceeds 80% by weight, it is undesirable from the view point of the stability at storing.

(i) Compounds each having an N-hydroxymethyl group, an N-alkoxymethyl group, or an N-acyloxymethyl group.

(ii) Epoxy compounds.

These crosslinking agents are explained in detail below.

(i) As the compounds each having an N-hydroxymethyl group, an N-alkoxymethyl group, or an N-acyloxymethyl group, there are the monomers, oligomers, melamine-formaldehyde condensation products and the urea-formaldehyde condensation products disclosed in EP-A-0133216 and West German Patents 3,634,671 and 3,711,264; the alkoxy-substituted compounds disclosed in EP-A-0212482; and the benzoguanamine-formaldehyde condensation products disclosed in JP-A-8-109314, etc.

As more preferred examples, there are, for example, melamine-formaldehyde derivatives each having at least two free N-hydroxymethyl groups, N-alkoxymethyl groups, or N-acyloxymethyl groups, and of these derivatives, the N-alkoxymethyl group-having derivatives are particularly preferred.

(ii) As the epoxy compounds, there are monomer-, dimer-oligomer-, or polymer-form compounds each having at least one epoxy group. For example, there are the reaction product of bisphenol A and epichlorohydrin, the reaction product of a low-molecular weight phenol-formaldehyde resin and epichlorohydrin, etc. As other epoxy compounds, there are the epoxy resins described in U.S. Pat. No. 4,026,706 and British Patent 1,539,192.

(3) Compound generating an acid by electron beams or X-rays (hereinafter, the compound is sometimes referred to as acid generating agent):

The acid generating agents suitably used in the invention are shown by the formula (I) to formula (III) described above.

In the formulae (I) to (III), $R_1$ to $R_{37}$, which may be the same or different, each represents a hydrogen atom, a straight chain, branched, or cyclic alkyl group, a straight chain, branched, or cyclic alkoxy group, a hydroxyl group, a halogen atom, or a —S—$R_{38}$ group, wherein $R_{38}$ represents a straight chain, branched, or cyclic alkyl group or an aryl group. Also, at least two of $R_1$ to $R_{15}$, $R_{16}$ to $R_{27}$, or $R_{28}$ to $R_{37}$ may combine with each other to form a ring containing one kind or at least two kinds selected from a single bond, carbon, oxygen, sulfur, and nitrogen.

As the straight chain or branched alkyl group shown by $R_1$ to $R_{38}$, there are alkyl groups having from 1 to 4 carbon atoms, such as a methyl group, an ethyl group, a propyl group, an n-butyl group, a sec-butyl group, and a t-butyl group each may have a substituent. As the cyclic alkyl group, there are alkyl groups having from 3 to 8 carbon atoms, such as a cyclopropyl group, a cyclopentyl group, and a cyclohexyl group each may have a substituent.

As the straight chain or branched alkoxy group shown by $R_1$ to $R_{37}$, there are alkoxy groups having from 1 to 8 carbon atoms, such as a methoxy group, an ethoxy group, a hydroxyethoxy group, a propoxy group, an n-butoxy group, an isobutoxy group, a sec-butoxy group, a t-butoxy group, an octyloxy group.

As the cyclic alkoxy group, there are, for example, a cyclopentyloxy group and a cyclohexyloxy group.

As the halogen atom shown by $R_1$ to $R_{37}$, there are a fluorine atom, a chlorine atom, a bromine atom, and an iodine atom.

As the aryl shown by $R_{38}$, there are aryl groups having from 6 to 14 carbon atoms, which may have a substituent, such as a phenyl group, a tolyl group, a methoxyphenyl group, and a naphthyl group.

As these substituents described above, there are preferably an alkoxy group having from 1 to 4 carbon atoms, a halogen atom (e.g., fluorine atom, chlorine atom, and iodine atom), an aryl group having from 6 to 10 carbon atoms, an alkenyl group having from 2 to 6 carbon atoms, a cyano group, a hydroxyl group, a carboxyl group, an alkoxycarbonyl group, a nitro group, etc.

Also, as the ring containing one kind or at least two kinds selected from a single bond, carbon, oxygen, sulfur, and nitrogen formed by combining at least two of $R_1$ to $R_{15}$, $R_{16}$ to $R_{27}$, or $R_{28}$ to $R_{37}$ with each other, there are, for example, a furan ring, a dihydrofuran ring, a pyran ring, a trihydropyran ring, a thiophene ring, an a pyrrole ring.

In the formulae (I) to (III), X⁻ is the anion of benzenesulfonic acid, naphthalenesulfonic acid, or anthracenesulfonic acid having at least one kind selected from the following groups;

at least one fluorine atom, a straight chain, branched, or cyclic alkyl group substituted by at least one fluorine atom, a straight chain, branched, or cyclic alkoxy group substituted by at least one fluorine atom, an acyl group substituted by at least one fluorine atom, an acyloxy group substituted by at least one fluorine atom, a sulfonyl group substituted by at least one fluorine atom, a sulfonyloxy group substituted by at least one fluorine atom, a sulfonylamino group substituted by at least one fluorine atom, an aryl group substituted by a fluorine atom, an aralkyl group substituted by at least one fluorine atom, and an alkoxycarbonyl group substituted by at least one fluorine atom.

As the above-described straight chain, branched, or cyclic alkyl group, the alkyl groups having from 1 to 12 carbon atoms and being substituted by from 1 to 25 fluorine atoms are preferred. Practically, there can be illustrated a trifluoromethyl group, a pentafluoroetyl group, a 2,2,2-trifluoroethyl group, a heptafluoropropyl group, a heptafluoroisoporpyl group, a perfluorobutyl group, a perfluorocyclooctyl group, a perfluorododecyl group, a perfluorohexyl group, etc. In these alkyl groups, the perfluoroalkyl groups having from 1 to 4 carbon atoms, all substituted by fluorine are preferred.

As the above-described straight chain, branched, or cyclic alkoxy group, the alkoxy groups having from 1 to 12 carbon atoms and being substituted by from 1 to 25 fluorine atoms are preferred. Practically, there can be illustrated a trifluoromethoxy group, a pentafluoroethoxy group, a heptafluoroisopropyloxy group, a perfluorobutoxy group, a perfluorooctyloxy group, a perfluorododecyloxy group, a perfluorocyclohexyloxy group, etc. Of these alkoxy group, the perfluoroalkoxy groups having from 1 to 4 carbon atoms, all substituted by fluorine are preferred.

As the above-described acyl group, the alkyl groups having from 2 to 12 carbon atoms and being substituted by from 1 to 23 fluorine atoms are preferred. Practically, there can be illustrated a trifluoroacetyl group, a fluoroacetyl group, a pentafluoropropionyl group, a pentafluorobenzyl group, etc.

As the above-described acyloxy group, the acyloxy groups having from 2 to 12 carbon atoms and being substituted by from 1 to 23 fluorine atoms are preferred. Practically, there can be illustrated a trifluoroacetoxy group, a fluoroacetoxy group, a pentafluoropropionyloxy group, a pentafluoro-benzoyloxy group, etc.

As the above-described sulfonyl group, the sulfonyl groups having from 1 to 12 carbon atoms and being substituted by from 1 to 25 fluorine atoms are preferred.-

Practically, there can be illustrated a trifluoromethanesulfonyl group, a perfluorooctanesulfonyl group, a perfluorobutanesulfonyl group, a perfluorooctanesulfonyl group, a pentafluorobenzenesulfonyl group, a 4-trifluoromethylbenzenesulfonyl group, etc.

As the above-described sulfonyloxy group, the sulfonyloxy group having from 1 to 12 carbon atoms and being substituted by from 1 to 25 fluorine atoms are preferred. Practically, there can be illustrated a trifluoromethanesulfonyloxy group, a perfluorobutanesulfonyloxy group, a 4-trifluoromethylbenzenesulfonyloxy group, etc.

As the above-described sulfonylamino group, the sulfonylamino groups having from 1 to 12 carbon atoms and being substituted by from 1 to 25 carbon atoms are preferred. Practically, there can be illustrated a trifluoromethanesulfonylamino group, a perfluorobutanesulfonylamino group, a perfluorooctanesulfonylamino group, a pentafluorobenzenesulfonylamino group, etc.

As the above-described aryl group, the aryl groups having from 6 to 14 carbon atoms and being substituted by from 1 to 9 fluorine atoms are preferred. Practically, there can be illustrated a pentafluorophenyl group, a 4-trifluoromethylphenyl group, a heptafluoronaphthyl group, a nonafluoroanthranyl group, a 4-fluorophenyl group, a 2,4-difluorophenyl group, etc.

As the above-described aralkyl group, the aralkyl groups having from 7 to 10 carbon atoms and being substituted by from 1 to 15 fluorine atoms are preferred. Practically, there can be illustrated a pentafluozophenylmethyl group, a pentafluorophenylethyl group, a perfluorobenzyl group, a perfluorophenetyl group, etc.

As the above-described alkoxycarbonyl group, the alkoxycarbonyl groups having from 2 to 13 carbon atoms and being substituted by from 1 to 25 fluorine atoms are preferred. Practically, there can be illustrated a trifluoromethoxycarbonyl group, a pentafluoroethoxycarbonyl group, a pentafluorophenoxycarbonyl group, a perfluorobutoxycarbonyl group, a perfluorooctyloxycarbonyl group, etc.

The most preferred $X^-$ is fluorine-substituted benzenesulfonic acid anions and of these anions, a pentafluorobenzenesulfonic acid anion is particularly preferred.

Also, the above-described benzenesulfonic acid, naphthalene sulfonic acid, or anthracenesulfonic acid each having a fluorine substituent may be further substituted by a straight chain, branched, or cyclic alkoxy group, an acyl group, an acyloxy group, a sulfonyl group, a sulfonyloxy group, a sulfonylamino group, an aryl group, an aralkyl group, an alkoxycarbonyl group (the carbon atom ranges of these groups are same as those of the above-described groups), a halogen (excluding fluorine), a hydroxyl group, a nitro group, etc.

Then, practical examples of the compounds shown by the formulae (I) to (III) are shown below but the compounds are not limited to them.

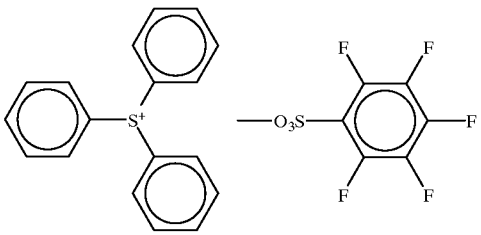

(I-1)

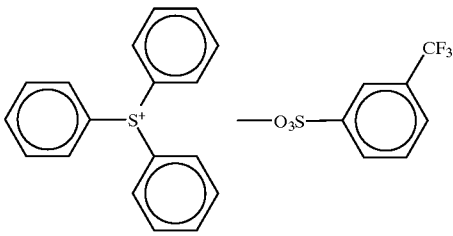

(I-2)

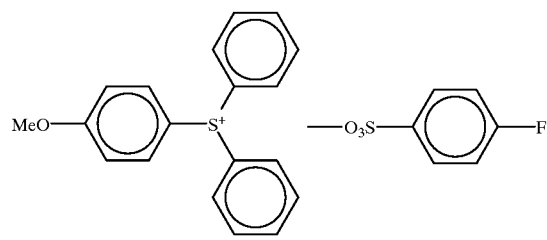

(I-3)

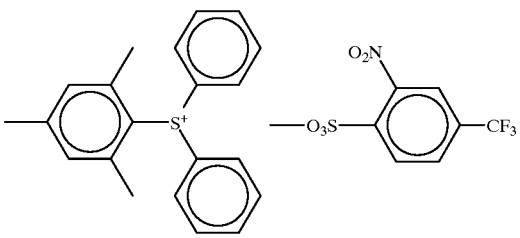

(I-4)

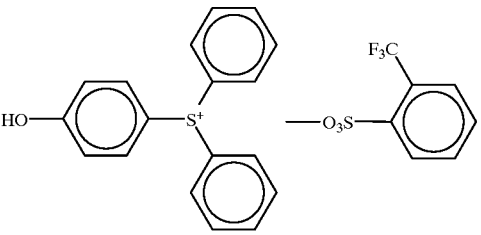

(I-5)

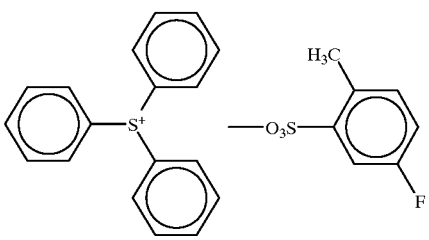

(I-6)

(I-7)
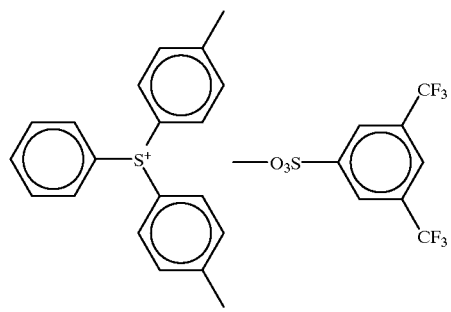
(I-8)
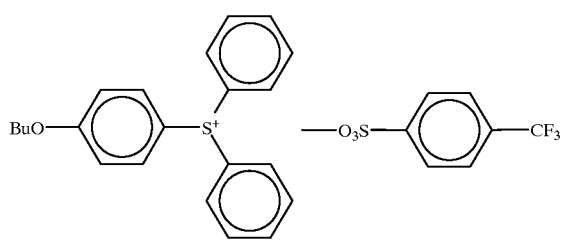
(I-9)
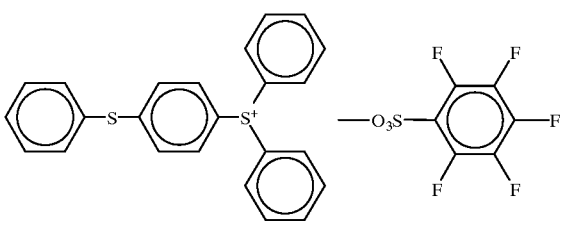
(I-10)
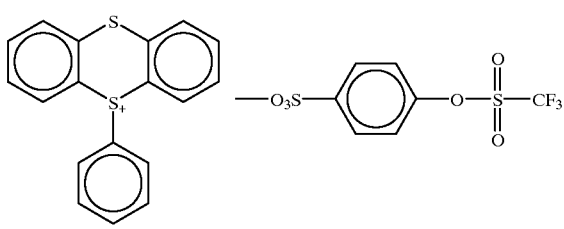
(I-11)
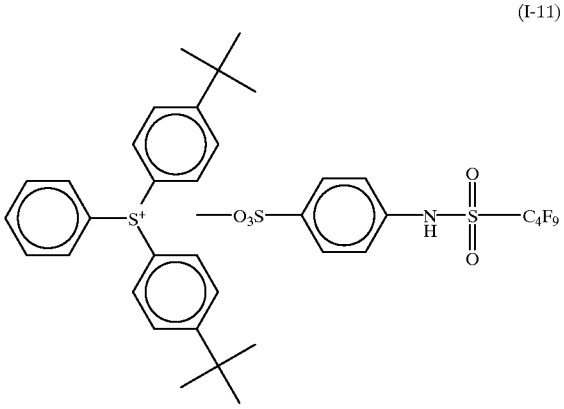
(I-12)
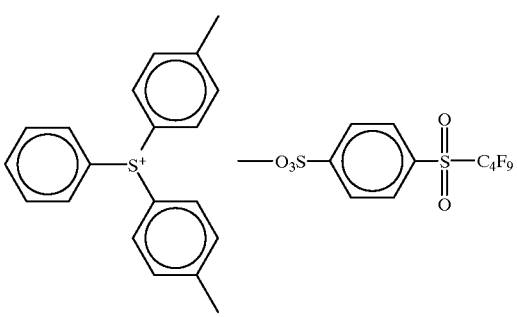
(I-13)
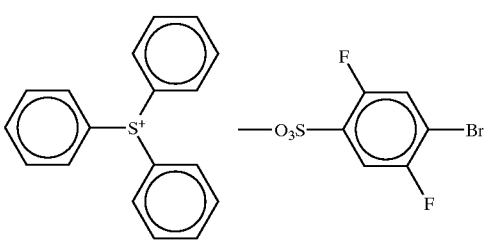
(I-14)
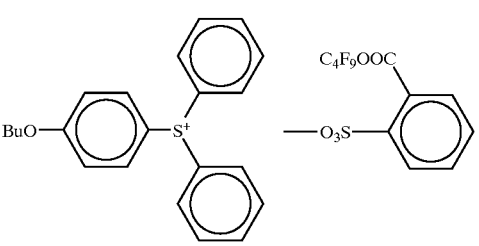
(II-1)
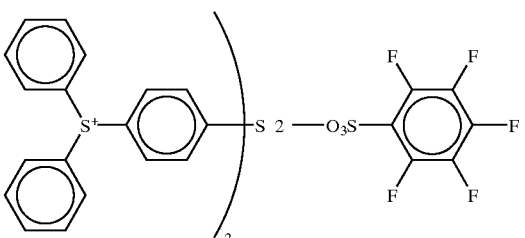
(II-2)
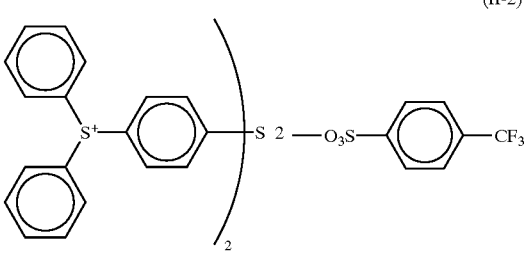

(II-3)
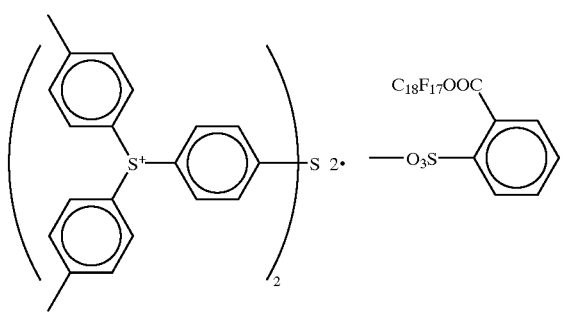

(II-4)
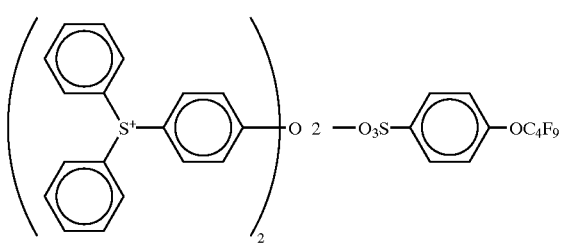

(II-5)
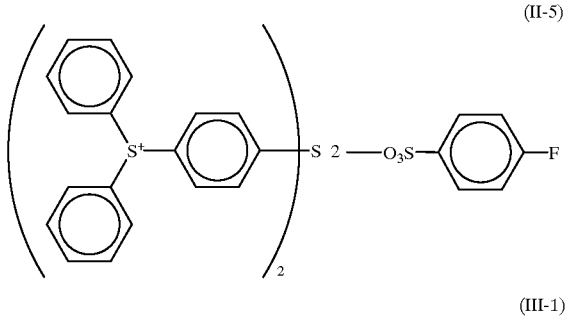

(III-1)
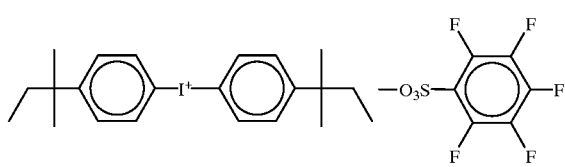

(III-2)
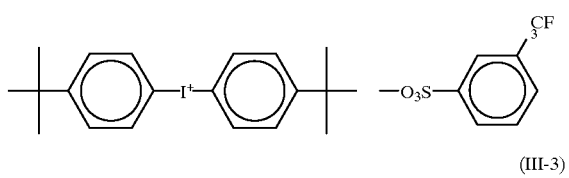

(III-3)
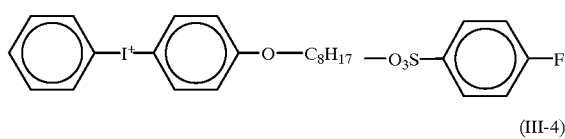

(III-4)
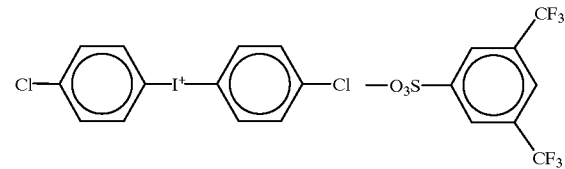

(III-5)
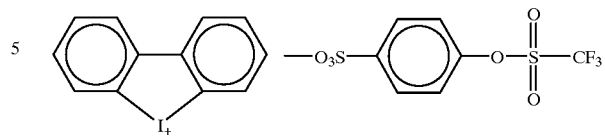

(III-6)
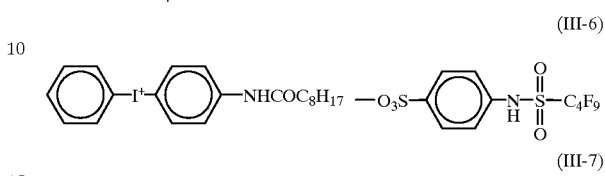

(III-7)
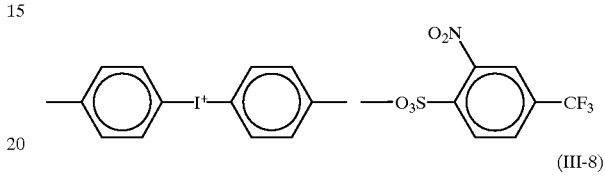

(III-8)
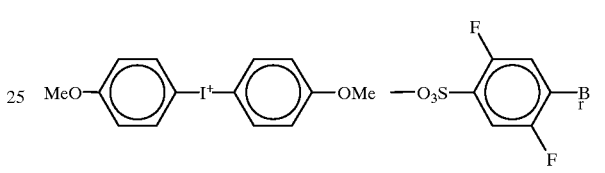

The compounds shown by the formula (I) and the formula (II) can be synthesized by a method by reacting an aryl Grignard reagent such as, for example, aryl magnesium bromide, etc., and a substituted or unsubstituted phenyl sulfoxide, and salt-exchanging the triarylsulfonium halide obtained with a corresponding sulfonic acid, a method of condensing and salt-exchanging a substituted or unsubstituted phenyl sulfoxide with a corresponding aromatic compound using an acid catalyst such as methanesulfonic acid/diphosphorus pentaoxide or aluminum chloride, etc., or a method of condensing and salt-exchanging a diaryl iodonium salt with diaryl sulfide, etc.

The compounds of the formula (III) can be synthesized by reacting aromatic compounds using a periodate.

The content of each of the compounds shown by the formulae (I) to (III) is suitable from 0.1 to 20% by weight, preferably from 0.5 to 10% by weight, and more preferably from 1 to 10% by weight to the total solid components of the negative-working resist composition.

(Other compounds generating acid by electron beams or X-rays)

In the invention, in addition to the compounds shown by the above-described formulae (I) to (III), the following other compounds generating an acid by decomposing by the irradiation of other radiations can be used.

Also, each of the compounds shown by the above-described formulae (I) to (III) can be used together with each of the following other compounds generating an acid by decomposing by the irradiation of other radiations.

The molar ratio of the compound shown by the formula (I) to (III) in the invention to other compound generating an acid by electron beams or X-rays, which can be used together with the compound in the invention is from 100/0 to 20/80, preferably from 90/10 to 40/60, and more preferably from 80/20 to 50/50.

Also, the content of the other compound generating an acid by electron beams or X-rays, which can be used together with the compound of the formula (I) to (III), in the resist composition is suitably from 0.1 to 20% by weight, preferably from 0.5 to 10% by weight, and more preferably from 1 to 10% by weight to the total solid components of the negative-working resist composition.

As such other compounds generating an acid by electron beams or X-rays, photoinitiators for cationic polymerizations, photoinitiators for photoradical polymerizations, photoachromatic agents for dyes, photo-discoloring agents, or known compounds of generating an acid by light used for a microresist, etc., and the mixture of them can be properly selected for use.

For example, the onium salts such as the diazonium salts described in S. I. Schlesinger, "Photogr. Sci. Eng.", 18, 387(1974), T. S. Bal et al, "Polymer", 21, 423 (1980), etc.; the ammonium salts described in U.S. Pat. Nos. 4,069,055, 4,069,056, and Re 27,992, and JP-A-3-140140, etc.; the phosphonium salts described in D. C. Nicker et al, "Macromolecules", 17, 2468(1984), C. S. Wen et al., "The. Proc. Conf. Rad. Curing Asia", p478 Tokyo, Oct. (1988), U.S. Pat. Nos. 4,069,055, 4,069,056, etc.; the iodonium salts described in J. V. Crivello et al, "Macromolecules", 10(6), 1307(1977), "Chem. & Eng. News", Nov. 28, p31(1988), European Patents 104,143, 339,049, and 410,201, JP-A-2-150848, JP-A-2-296514, etc.; the sulfonium salts described in J. V. Crivello et al, "Polymer J.", 17, 73(1985), J. V. Crivello et al, "J. Org. Chem.", 43, 3055(1978), W. R. Watt, et al, "J. Polymer Sci." Polymer Chem. Ed., 22, 1789(1984), J. V. Crivello et al, "Polymer Bull.", 14, 279(1985), J. V. Crivello et al, "Macromolecules", 14(5), 1141(1981), J. V. Crivello et al, "J. Polymer Sci.", Polymer Chem. Ed., 17, 2877(1979), European Patents 370,693, 161,811, 410,201, 339,049, 233,567, 297,443, and 297,442, U.S. Pat. Nos. 3,902,114, 4,933,377, 4,760,013, 4,734,444, and 2,833,827, German Patents 2,904,626, 3,604,580, and 3,604,581, etc.; the selenonium salts described in J. V. Crivello et al, "Macromolecules", 10(6), 1307(1977), J. V. Crivello et al, "J. Polymer Sci.", Polymer Chem. Ed., 17, 1047(1979), etc.; and the arsonium salts described in C. S. Wen et al, "The. Proc. Conf. Rad. Curing ASIA", p478, Tokyo, Oct.(1988), etc.; the organic halogen compounds described in U.S. Pat. No. 3,905,815, JP-B-46-4605, JP-A-48-36281, JP-A-55-32070, JP-A-60-239736, JP-A-61-169835, JP-A-61-169837, JP-A-62-58241, JP-A-62-212401, JP-A-63-70243, and JP-A-63-298339, etc.; The organic metal/organic halides described in K. Meier et al, "J. Rad. Curing", 13(4), 26(1986), T. P. Gill et al., "Inorg. Chem.", 19, 3007(1980), D. Astruc, "Acc. Chem. Res.", 19(12), 377(1986), JP-A-2-161445, etc.; the photo-acid generators having an o-nitrobenzyl type protective group described in S. Hayase et al, "J. Polymer Sci.", 25, 753(1987), E. Reichmanis et al, "J. Polymer Sci.", Polymer Chem., Ed., 23, 1(1985), Q. Q. Zhu et al., "J. Photochem.", 36, 85, 39, 317(1987), B. Amit et al., "Tetrahedron Lett.", (24) 2205(1973), D. H. R. Barton et al, "J. Chem. Soc., 3571(1965), P. M. Collins et al., "J. Chem. Soc.", Perkin I, 1695(1975), M. Rudinstein et al., "Tetrahedron Lett.", (17), 1445(1975), J. W. Walker et al., "J. Am. Chem. Soc., 110, 7170(1988), S. C. Busman et al., "J. Imaging Technol.", 11(4), 191(1985), H. M. Houlihan et al., "Macromolecules", 21, 2001(1988), P. M. Collins et al., "J. Chem. Soc.", Chem. Commun., 532(1972), S. Hayase et al., "Macromolecules", 18, 1799(1985), E. Reichmanis et al., "J. Electrochem. Soc.", Solid State Sci. Technol., 130(6), F. M. Houlihan et al., "Macromolecules", 21, 2001(1988), European Patents 0290,750, 046,083, 156,535, 271,851, and 0,388,343, U.S. Pat. Nos. 3,901,710 and 4,181,531, JP-A-60-198538 and JP-A-53-133022, etc.; the compounds generating sulfonic acid by causing photodecomposition, such as iminosulfonate, etc., described in M. TUNOOKA et al., "Polymer Preprints Japan", 55(8), G. Berner et al., "J. Rad. Curing", 13(4), W. J. Mijs et al., "Coating Technol.", 55(697), 45(1983), Akzo, H. Adachi et al., "Polymer Preprints, Japan", 37(3), European Patents 0199672, 084515, 044115, 618564, and 0101122, U.S. Pat. Nos. 4,371,605 and 4,431,774, JP-A-64-18143, JP-A-2-245756, JP-A-3-140109, etc., and the disulfon compounds described in JP-A-61-166544, etc.

Also, a compound having introduced a group or a compound generating an acid by such a light to the main chain or the side chain, for example, the compounds described, for example, in M. E. Woodhouse et al, "J. Am. Chem. Soc.", 104, 5586(1982), S. P. Pappas et al., "J. Imaging Sci.", 30(5), 218(1986), S. Kondo et al., "Makromol. Chem.", Rapid Commun., 9, 625(1988), Y. Yamada et al., "Makromol. Chem., 152, 153, 163(1972), J. V. Crivello et al., "J. Polymer Sci.", Polymer Chem. Ed., 17, 3845(1979), U.S. Pat. No. 3,849,137, German Patent 3914407, JP-A-63-26653, JP-A-55-164824, JP-A-62-69263, JP-A-63-146038, JP-A-63-163452, JP-A-62-153853, and JP-A-63-146029, etc., can be used.

Furthermore, the compounds generating an acid by light described in V. N. R. Pillai, "Synthesis", (1), 1(1980), A. Abad et al., "Tetrahedron Lett.", (47), 4555(1971), D. H. R. Barton et al, J. Chem. Soc., (C), 329(1970), U.S. Pat. No. 3,779,778, European Patent 126,712, etc., can be used.

(4) Other components used for the composition of the invention:

The negative-working resist compositions of the invention can, if necessary, further contain organic basic compounds, dyes, surface active agents, etc.

(4)-1 Dyes:

As suitable dyes, there are oily dyes and basic dyes. Specifically, there can be illustrated Oil Yellow #101, Oil Yellow #103, Oil Pink #312, Oil Green BG, Oil Blue BOS, Oil Blue #603, Oil Black BY, Oil Black BS, Oil Black T-505 (the above, manufactured by Orient Kagaku Kogyo K.K.), Crystal Violet (CI 42555), Methyl Violet (CI 42535), Rhodamine B (CI 45170B), Malachite Green (CI 42000), Methylene Blue (CI 152015), etc.

(4)-2 Organic basic compounds:

The preferred organic basic compounds which can be used in the invention are compounds having a stronger basic property than phenol. In these compounds, nitrogen-containing basic compounds are preferred.

As preferred chemical environments, there are the structures of following formulae (A) to (E).

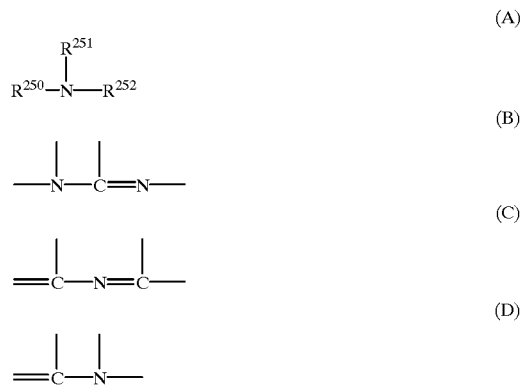

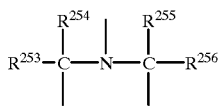
(E)

In the above formulae, $R^{250}$, $R^{251}$, and $R^{252}$, which may be the same or different, each represents a hydrogen atom, an alkyl group having from 1 to 6 carbon atoms, an aminoalkyl group having from 1 to 6 carbon atoms, a hydroxyalkyl group having 1 to 6 carbon atoms, or a substituted or unsubstituted aryl group having from 6 to 20 carbon atoms, and in this case, $R^{251}$ and $R^{252}$ may combine with each other to form a ring.

Also $R^{253}$, $R^{254}$, $R^{255}$, and $R^{256}$, which may be the same or different, each represents an alkyl group having from 1 to 6 carbon atoms.

The more preferred compound is a nitrogen-containing basic compound having at least two nitrogen atoms having a different chemical environment in one molecule, and particularly preferably a compound containing both ring structures containing a substituted or unsubstituted amino group and a nitrogen atom or a compound containing an alkylamino group.

As the preferred practical examples of the compounds, there are substituted or unsubstituted guanidine, substituted or unsubstituted aminopyridine, substituted or unsubstituted aminoalkylpyridine, substituted or unsubstituted aminopyrrolidine, substituted or unsubstituted indazole, imidazole, substituted or unsubstituted pyrazole, substituted or unsubstituted pyrazine, substituted or unsubstituted pyrimidine, substituted or unsubstituted purine, substituted or unsubstituted imidazoline, substituted or unsubstituted pyrazoline, substituted or unsubstituted piperazine, substituted or unsubstituted aminomorpholine, substituted or unsubstituted aminoalkylmorpholine, etc. A preferred substituent includes an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group, and a cyano group.

As the particularly preferred compounds, there are guanidine, 1,1-dimethylguanidine, 1,1,3,3-tetramethylguaanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)-piperidine, 4-amino-2,2,6,6-tetramethylpiperidine, 4-piperidinopiperidine, 2-iminopiperidine, 1-(2-aminoethyl)pyrolidine, pyrazole, 3-amino-5-methylpyrazole, 5-mino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)-morpholine, etc., but the compounds are not limited to these compounds.

These nitrogen-containing basic compounds are used singly or as a combination of two or more kinds thereof.

The using ratio of the compound generating an acid by electron beams or X-rays to the organic basic compound in the resist composition of the invention is preferably (the compound generating an acid by electron beams or X-rays)/(the organic basic compound) (mol ratio)=2.5 to 300.

When the mol ratio is less than 2.5. the resist becomes a low sensitivity and it sometimes happens that the resolving power is lowered, and when the mol ratio exceeds 300, the thickness of the resist pattern becomes large during the time after light-exposure to heat treatment, and it sometimes happen that the resolving power is also lowered. (The compound generating an acid by electron beams or X-rays)/(the organic basic compound) (mol ratio) is preferably from 5.0 to 200, and more preferably from 7.0 to 150.

(4)-3 Solvents:

The negative-working resist composition of the invention is dissolved in a solvent dissolving the above-described components and is coated on a support. As the solvent used, ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformaide, dimethyl sulfoxide, N-methylpyrrolidone, tetrahydrofuran, etc., are preferred and these solvents are used singly or as a mixture thereof. The particularly preferred solvents are propylene glycol monomethyl ether acetate and a mixed solvent of propylene glycol monomethyl ether acetate and propylene glycol monomethyl ether.

(4)-4 Surface active agents:

The negative-working resist composition of the invention can preferably contain a fluorine-base and/or silicon-base surface active agent.

It is preferable that the negative-working resist composition of the invention contain one of a fluorine-base surface active agent, a silicon-base surface active agent, and a surface active agent containing both a fluorine atom and a silicon atom, or two or more kinds of these surface active agents.

That the negative-working resist composition of the invention contains the above-described surface active agent together with the above-described components is particularly effective when the line width of pattern is more fine, and in this case the occurrence of the development defects is more prevented.

As these surface active agents, there are the surface active agents described, for example, in JP-A-62-36663, JP-A-61-226746, JP-A-61-226745, JP-A-62-170950, JP-A-63-34540, JP-A-7-230165, JP-A-8-62834, JP-A-9-54432, and JP-A-9-5988, and also the following commercially available surface active agents can be used as they are.

As the commercially available surface active agents which can be used in the invention, there can be illustrated, for example, the fluorine-base surface active agents or the silicon-base surface active agents such as Eftop EF301 and EF303 (manufactured by Sin Akita Kasei K.K.), Florad FC430, and FC431 (manufactured by SUMITOMO 3M LTD.), Megafac F171, F173, F176, F189, R08 (manufactured by DAINIPPON INK & CHEMICALS, INC.), Surflon S-382, SC 101, 102, 103, 104, 105 and 106 (manufactured by Asahi Glass Company Ltd.) and Troysol S-366 (manufactured by Troy Chemical Co.), etc. Also, the polysiloxane polymer KP-341 (manufactured by Shin-Etsu Chemical Co., Ltd.) can be used as a silicon-base surface active agent.

The compounding amount of the above-described surface agent is usually from 0.001% by weight to 2% by weight, and preferably from 0.01% by weight to 1% by weight based on the solid components in the composition of the invention. These surface active agents may be added singly or as a combination of them.

As other surface active agents which can be used in the invention, there are specifically following nonionic surface active agents. That is, they are polyoxyethylene alkyl ethers such as polyoxyethylene lauryl ether, polyoxyethylene stearyl ether, polyoxyethylene cetyl ether, polyoxyethylene oleyl ether, etc.; polyoxyethylene alkylaryl ethers such as polyoxyethylene octylphenol ether, polyoxyethylene nonylphenol ether, etc.; polyoxyethyleneepolyoxypropylene block copolymers; sorbitan fatty acid esters such as sorbitan monolaurate, sorbitan monopalmitate, sorbitan monostearate, sorbitan monooleate, sorbitan trioleate, sorbitan tristearate, etc.; polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, etc.

The compounding amount of the other surface active agent is usually not more than 2 parts by weight, and preferably not more than 1 part by weight per 100 parts by weight of the solid components in the composition of the invention.

In the pattern formation process on the resist film in the production of a precise integrated circuit element, the negative-working resist composition of the invention is coated on a substrate (for example, a transparent substrate such as a silicon/silicon dioxide film, a glass substrate, an ITO substrate, etc.), then irradiating the coated layer using an electron ray or X-ray imaging apparatus, and by heating, developing, rinsing, and drying, a good resist pattern can be formed.

As a developer applied to the negative-working resist composition of the invention, an aqueous solution of an alkali, for example, inorganic alkalis such as sodium hydroxide, potassium hydroxide, sodium carbonate, sodium silicate, sodium metasilicate, aqueous ammonia, etc.; primary amines such as ethylamine, n-propylamine, etc.; secondary amines such as diethylamine, di-n-butylamine, etc.; tertiary amines such as triethylamine, methyldiethylamine, etc.; alcoholamines such as dimethylethanolamine, triethanolamine, etc.; quaternary ammonium salts such as tetramethylammonium hydroxide, tetraethylammonium hydroxide, choline, etc.; cyclic amines such as pyrrole, piperidine, etc., can be used. Furthermore, to the above-described aqueous solution of the alkali can be added suitable amounts of an alcohol such as isopropyl alcohol, etc., and a surface active agent such as a nonionic surface active agent.

In these developers, the aqueous solution of the quaternary ammonium salt is preferred and the aqueous solution of tetramethylammonium hydroxide or choline is more preferred.

Then, the present invention is explained in detail by the following examples and the invention is not limited by these examples.

1. Synthesis of constituting materials:
(1) Synthesis of alkali-soluble resin:
(1-1) In dry THF were dissolved 16.4 g (0.1 mol) of 3,4-dimethoxystyrene and 158.7 g (0.9 mol) of 4-t-butoxystyrene, and after heating the solution to 70° C. under nitrogen gas stream, an azo-base radical initiator V-601 manufactured by Wako Pure Chemical Industries, Ltd. was added thereto in an amount of 2% of the total mol number of the above-described monomers. After reacting for 8 hours, the reaction liquid was diluted with THF, the product was precipitated and purified in hexane, and a polymer was collected. By decomposing the polymer with an acid by an ordinary method, (P-1) was obtained. By the GPC measurement, the weight-average molecular weight (Mw) and the molecular weight dispersion degree (Mw/Mn) were determined.

(1-2) Using the same method as described above, and a protected monomer (such as, 4-benzyloxystyrene), by properly using the cationic polymerization by $BF_3 \cdot EtO_2$, (P-1'), (P-1"), and (P-2) to (P-51) were synthesized.

(1-3) In dry THF were dissolved 1.64 g (0.01 mol) of 3,4-dimethoxystyrene and 15.9 g (0.09 mol) of 4-t-butoxystyrene, using 1 mmol of s-butyl lithium in a sealed tube at −78° C., and by breaking the glass seal, the reaction was initiated. The reaction product was precipitated in a large amount of hexane, and the powders were collected and purified. By treating the product with an acid by an ordinary method, (P-1''') was obtained. (2) Synthesis of crosslinking agent:

(2-1) Synthesis of crosslinking agent [HM-0]:
After placing p-aminophenol (1 mol) and sodium acetate (1 mol) in a flask together with acetone (1 liter), isobutyric acid chloride (1 mol) was added dropwise to the mixture under ice-cooling. After 5 hours, the reaction mixture was added to ice-water to deposit crystals and the crystals were collected by filtration to obtain HM-0-X with the yield of 80%.

In a flask were placed the HM-1-X (0.8 mol), KOH (0.8 mol), 500 ml of water, and an aqueous solution of 37% formalin (4.8 mol), after heating the mixture to 50° C. for 5 hours, the reaction mixture was neutralized with acetic acid, the solvent was concentrated in a reduced pressure, the oily product obtained was dissolved in ethyl acetate/methanol of 1/1, and by separating the product by an $SiO_2$ column chromatography, the desired product HM-0 ($L_1$=$L_2$=$CH_2OH$) was obtained as colorless crystals with the total yield of 50%.

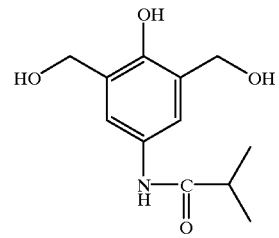

[HM-0]

(2-2) Synthesis of crosslinking agent [HM-1]:
In an aqueous solution of 10% potassium hydroxide was dissolved 20 g of 1-[α-methyl-α-(4-hydroxyphenyl)ethyl]-4-[α,α-bis(4-hydroxyphenyl)ethyl]benzene (Trisp-PA, trade name, manufactured by Honshu Chemical Industry Co., Ltd.) with stirring. Then, while stirring the solution, 60 ml of an aqueous solution of 37% formalin was gradually added to the solution over a period of one hour at room temperature. Furthermore, after stirring the mixture for 6 hours at room temperature, the reaction mixture was poured into a diluted aqueous sulfuric acid solution. Precipitates formed were collected by filtration, and after sufficiently washing with water, the precipitates were recrystallized from 30 ml of methanol to obtain 20 g of the white powder of the phenol derivative [HM-1] having a hydroxymethyl group of the following structure. The purity was 92% (liquid chromatography method).

[HM-1]

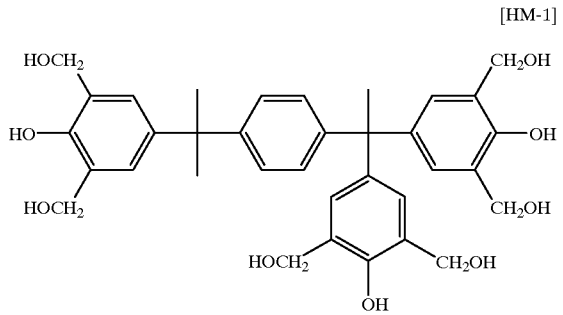

(2-3) Synthesis of crosslinking agent [MM-1]:

In one liter of methanol was dissolved 20 g of the phenol derivative [HM-1] having a hydroxymethyl group obtained in the above-described synthesis with stirring by heating. Then, 1 ml of concentrated sulfuric acid was added to the solution and the mixture was refluxed for 12 hours. After the reaction was over, the reaction liquid was cooled and 2 g of potassium carbonate was added thereto. After sufficiently concentrating the mixture, 300 ml of ethyl acetate was added to the mixture. After washing the solution with water, the solution was concentrated to dryness to obtain 22 g of the white powder of the phenol derivative [MM-1] having a methoxymethyl group of the following structure. The purity was 90% (liquid chromatography method).

[MM-1]

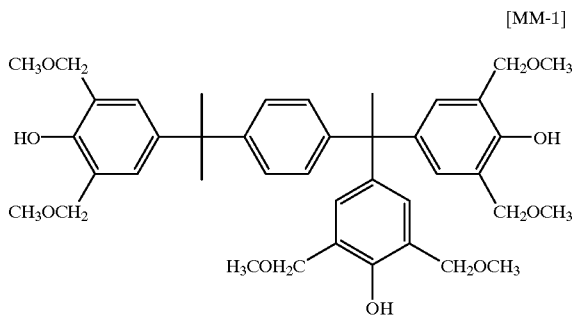

By following the similar method as above, crosslinking agents AL-1 and AL-2 shown below were synthesized.

(other crosslinking agents)

AL-1

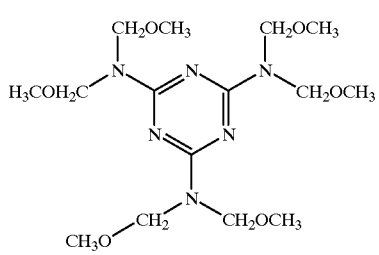

AL-2

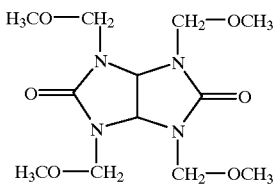

(3) Compound generating acid by electron beams or X-rays:

(3-1) Synthesis of tetramethylammonium salt of pentafluorobenzenesulfonic acid:

In 100 ml of methanol was dissolved 25 g of pentafluorobenzenesulfonyl chloride under ice-cooling and 100 g of an aqueous solution of 25% tetramethylammonium hydroxide was slowly added to the solution. When the mixture was stirred for 3 hours at room temperature, a solution of the tetramethylammonium salt of pentafluorobenzenesulfonic acid was obtained. The solution was used for salt-exchange of a sulfonium salt with a iodonium salt.

(3-2) Synthesis of triphenylsulfonium pentafluorobeznene sulfonate:

In 800 ml of benzene was dissolved 50 g of diphenyl sulfoxide and after adding thereto 200 g of aluminum chloride, the mixture was refluxed for 24 hours. The reaction liquid was slowly added to 2 liters of ice and after adding thereto 400 ml of concentrated sulfuric acid, the mixture was heated to 70° C. for 10 minutes. The aqueous solution was washed with 500 ml of ethyl acetate, and after filtering, a solution of 200 g of ammonium iodide dissolved in 400 ml of water was added thereto. The powder thus deposited was collected by filtration, and after washing with water, the powder was washed with ethyl acetate and dried to obtain 70 g of triphenylsulfonium iodide.

In 1000 ml of methanol was dissolved 30.5 g of triphenylsulfonium iodide, and after adding 19.1 g of silver oxide to the solution, the mixture was stirred for 4 hours at room temperature. The solution was filtered and a solution of an excessive amount of the tetramethylammonium salt of pentafluorobenzenesulfonic acid was added thereto. The reaction liquid was concentrated, the residue formed was dissolved in 500 ml of dichloromethane, and the solution was washed with an aqueous solution of 5% tetramethylammonium hydroxide and water. When the organic phase was dried by anhydrous sodium sulfate and concentrated, triphenylsulfonium pentafluorobenzene sulfonate (I-1) was obtained.

(3-3) Synthesis of di(4-t-amylphenyl)iodonium pentafluorobenzene sulfonate:

To a mixture of 60 g of t-amylbenzene, 39.5 g of potassium iodate, 81 g of acetic anhydride, and 170 ml of dichloromethane was slowly added dropwise 66.8 g of concentrated sulfuric acid under ice-cooling. After stirring for 2 hours under ice-cooling, the solution was further stirred at room temperature for 10 hours. To the reaction Liquid was added 500 ml of water under ice-cooling, the reaction mixture was extracted with dichloromethane, when after washing the organic phase with sodium hydrogencarbonate and water, the organic phase was concentrated, a di(4-t-amylphenyl)iodonium sulfate was obtained. The sulfate was added to a solution of an excessive amount of the tetramethylammonium salt of pentafluorobenzenesulfonic acid. After adding 500 ml of water to the solution, the solution was extracted with dichloromethane, and when after washing the organic phase with an aqueous solution of 5% tetramethylammonium hydroxide and water, the organic phase was concentrated, di (4-t-amylphenyl)iodonium pentafluorobenzene sulfonate (III-1) was obtained.

The acid generating agents PAG-1 and PAG-2 shown below can be synthesized by the same manner as described above.

(other acid generating agents)
PAG-1: $Ph_3S^+ \ CF_3SO_3^-$

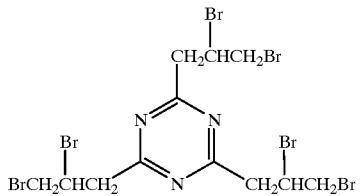

EXAMPLES

Example 1-1 to Example 1-67, and Comparative Example 1-101 to Comparative Example 1-108

(1) Coating of resist:

Using the alkali-soluble resins constituting the invention and comparative alkali-soluble resins, solutions of photoresist compositions of the compositions shown in Table 1 below were prepared.

After filtering each sample solution with a filter of 0.1 μm, the solution was coated on a silicon wafer using a spin coater, and by drying a vacuum adsorption-type hot plate of 120° C. for 90 seconds, a resist film having a thickness of 0.3 μm was obtained.

TABLE 1

|  | Resin (g) | Acid generating agent (g) | Crosslinking agent (g) | Surface active agent (mg) | Solvent (g) |
| --- | --- | --- | --- | --- | --- |
| Ex 1-2 | P-1 (1.05) | I-1 (0.07) | MM-1 (0.28) | TROYSOL S-366 (0.001) | Propylene glycol monomethyl ether acetate (8.5) |
| Ex 1-2 | P-1' (1.05) | ibid. | ibid. | ibid. | ibid. |
| Ex 1-3 | P-1" (1.05) | ibid. | ibid. | ibid. | ibid. |
| Ex 1-4 | P-2 (1.05) | ibid. | ibid. | ibid. | ibid. |
| Ex 1-5 | P-3 (1.05) | ibid. | ibid. | ibid. | ibid. |
| Ex 1-6 | P-4 (1.05) | ibid. | ibid. | ibid. | ibid. |
| Ex 1-7 | P-5 (1.05) | ibid. | ibid. | ibid. | ibid. |
| Ex 1-8 | P-6 (1.05) | ibid. | ibid. | ibid. | ibid. |
| Ex 1-9 | P-7 (1.05) | ibid. | ibid. | ibid. | ibid. |
| Ex 1-10 | P-8 (1.05) | ibid. | ibid. | ibid. | ibid. |
| Ex 1-11 | P-9 (1.05) | ibid. | ibid. | ibid. | ibid. |
| Ex 1-12 | P-10 (1.05) | ibid. | ibid. | ibid. | ibid. |
| Ex 1-13 | P-11 (1.05) | ibid. | ibid. | ibid. | ibid. |
| Ex 1-14 | P-12 (1.05) | ibid. | ibid. | ibid. | ibid. |
| Ex 1-15 | P-13 (1.05) | ibid. | ibid. | ibid. | ibid. |
| Ex 1-16 | P-14 (1.05) | ibid. | ibid. | ibid. | ibid. |
| Ex 1-17 | P-15 (1.05) | ibid. | ibid. | ibid. | ibid. |
| Ex 1-18 | P-16 (1.05) | ibid. | ibid. | ibid. | ibid. |
| Ex 1-19 | P-17 (1.05) | ibid. | ibid. | ibid. | ibid. |
| Ex 1-20 | P-18 (1.05) | ibid. | ibid. | ibid. | ibid. |
| Ex 1-21 | P-19 (1.05) | ibid. | ibid. | ibid. | ibid. |
| Ex 1-22 | P-20 (1.05) | ibid. | ibid. | ibid. | ibid. |
| Ex 1-23 | P-21 (1.05) | ibid. | ibid. | ibid. | ibid. |
| Ex 1-24 | P-22 (1.05) | ibid. | ibid. | ibid. | ibid. |
| Ex 1-25 | P-23 (1.05) | ibid. | ibid. | ibid. | ibid. |
| Ex 1-26 | P-24 (1.05) | ibid. | ibid. | ibid. | ibid. |
| Ex 1-27 | P-25 (1.05) | ibid. | ibid. | ibid. | ibid. |
| Ex 1-28 | P-26 (1.05) | ibid. | ibid. | ibid. | ibid. |
| Ex 1-29 | P-27 (1.05) | ibid. | ibid. | ibid. | ibid. |
| Ex 1-30 | P-28 (1.05) | ibid. | ibid. | ibid. | ibid. |
| Ex 1-31 | P-29 (1.05) | ibid. | ibid. | ibid. | ibid. |
| Ex 1-32 | P-30 (1.05) | ibid. | ibid. | ibid. | ibid. |
| Ex 1-33 | P-31 (1.05) | ibid. | ibid. | ibid. | ibid. |
| Ex 1-34 | P-32 (1.05) | ibid. | ibid. | ibid. | ibid. |
| Ex 1-35 | P-33 (1.05) | ibid. | ibid. | ibid. | ibid. |
| Ex 1-36 | P-34 (1.05) | ibid. | ibid. | ibid. | ibid. |
| Ex 1-37 | P-35 (1.05) | ibid. | ibid. | ibid. | ibid. |
| Ex 1-38 | P-36 (1.05) | ibid. | ibid. | ibid. | ibid. |
| Ex 1-39 | P-37 (1.05) | ibid. | ibid. | ibid. | ibid. |
| Ex 1-40 | P-38 (1.05) | I-1 (0.07) | MM-1 (0.28) | TROYSOL S-366 (0.001) | Propylene glycol monomethyl ether acetate (8.5) |
| Ex 1-41 | P-39 (1.05) | ibid. | ibid. | ibid. | ibid. |
| Ex 1-42 | P-40 (1.05) | ibid. | ibid. | ibid. | ibid. |
| Ex 1-43 | P-41 (1.05) | ibid. | ibid. | ibid. | ibid. |
| Ex 1-44 | P-42 (1.05) | ibid. | ibid. | ibid. | ibid. |
| Ex 1-45 | P-43 (1.05) | ibid. | ibid. | ibid. | ibid. |
| Ex 1-46 | P-44 (1.05) | ibid. | ibid. | ibid. | ibid. |
| Ex 1-47 | P-45 (1.05) | ibid. | ibid. | ibid. | ibid. |
| Ex 1-48 | P-46 (1.05) | ibid. | ibid. | ibid. | ibid. |
| Ex 1-49 | P-47 (1.05) | ibid. | ibid. | ibid. | ibid. |
| Ex 1-50 | P-48 (1.05) | ibid. | ibid. | ibid. | ibid. |
| Ex 1-51 | P-49 (1.05) | ibid. | ibid. | ibid. | ibid. |
| Ex 1-52 | P-50 (1.05) | ibid. | ibid. | ibid. | ibid. |
| Ex 1-53 | P-51 (1.05) | ibid. | ibid. | ibid. | ibid. |
| Ex 1-54 | P-1 (1.05) | ibid. | MM-2 (0.28) | ibid. | ibid. |
| Ex 1-55 | P-1 (1.05) | ibid. | MM-3 (0.28) | ibid. | ibid. |
| Ex 1-56 | P-1 (1.05) | ibid. | MM-4 (0.28) | ibid. | ibid. |
| Ex 1-57 | P-1 (1.05) | ibid. | MM-5 (0.28) | ibid. | ibid. |
| Ex 1-58 | P-1 (1.05) | ibid. | MM-0 (0.28) | ibid. | ibid. |
| Ex 1-59 | P-1 (1.05) | ibid. | MM-1/HM-1 (0.14/0.14) | ibid. | ibid. |
| Ex 1-60 | P-1 (1.05) | ibid. | MM-2/HM-2 (0.14/0.14) | ibid. | ibid. |
| Ex 1-61 | P-1 (1.05) | ibid. | MM-3/HM-3 (0.14/0.14) | ibid. | ibid. |
| Ex 1-62 | P-1 (1.05) | ibid. | MM-4/HM-4 (0.14/0.14) | ibid. | ibid. |
| Ex 1-63 | P-1 (1.05) | ibid. | MM-5/HM-5 (0.14/0.14) | ibid. | ibid. |
| Ex 1-64 | P-1 (1.05) | PAG-1 | MM-1 (0.28) | ibid. | ibid. |
| Ex 1-65 | P-1 (1.05) | PAG-2 | MM-1 (0.28) | ibid. | ibid. |
| Ex 1-66 | P-1 (1.05) | I-1 (0.07) | AL-1 (0.28) | ibid. | ibid. |
| Ex 1-67 | P-1 (1.05) | I-1 (0.07) | AL-2 (0.28) | ibid. | ibid. |
| CE 1-101 | P-101 (1.05) | I-1 (0.07) | MM-1 (0.28) | ibid. | ibid. |
| CE 1-102 | P-102 (1.05) | I-1 (0.07) | MM-1 (0.28) | ibid. | ibid. |
| CE 1-103 | P-101 (1.05) | PAG-1 | MM-1 (0.28) | ibid. | ibid. |
| CE 1-104 | P-102 (1.05) | PAG-2 | MM-1 (0.28) | ibid. | ibid. |
| CE 1-105 | P-101 (1.05) | I-1 (0.07) | AL-1 (0.28) | ibid. | ibid. |
| CE 1-106 | P-102 (1.05) | I-1 (0.07) | AL-2 (0.28) | ibid. | ibid. |
| CE 1-107 | P-101 (1.05) | PAG-1 | AL-1 (0.28) | ibid. | ibid. |
| CE 1-108 | P-102 (1.05) | PAG-2 | AL-2 (0.28) | ibid. | ibid. |

Ex: Example
CE: Comparative Example

The abbreviations used in Table 1 show the following contents.
| | <Alkali-soluble resin constituting the invention> | | Mw | Mw/Mn |
|---|---|---|---|---|
| (P-1) | 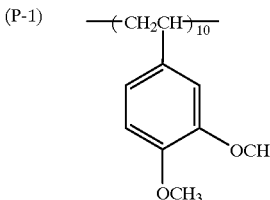 | 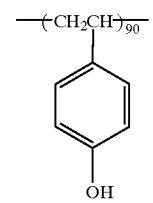 | 12,000 | 1.88 |
| (P-1') | 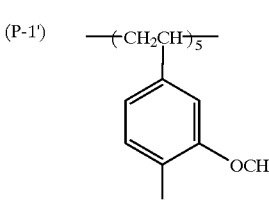 | 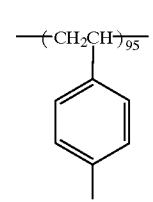 | 11,900 | 1.89 |
| (P-1") | 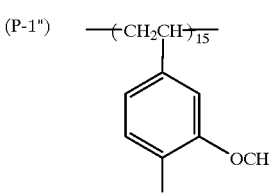 | 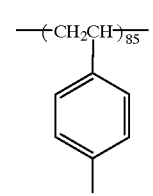 | 12,500 | 1.92 |
| (P-1''') | 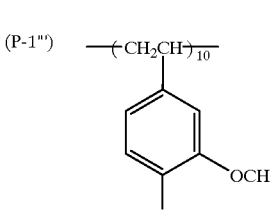 | 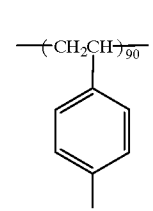 | 10,500 | 1.12 |
| (P-2) | 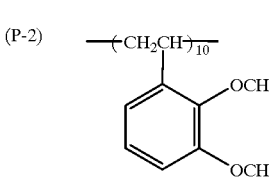 | 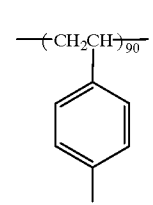 | 11,500 | 1.79 |
| (P-3) | 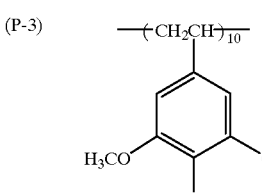 | 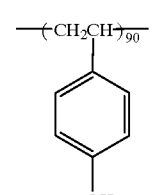 | 10,200 | 1.69 |

-continued
<Alkali-soluble resin constituting the invention>
| | | | Mw | Mw/Mn |
|---|---|---|---|---|
| (P-4) | 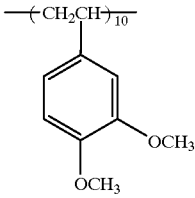 | 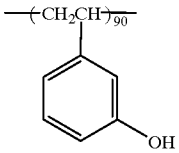 | 12,000 | 2.33 |
| (P-5) | 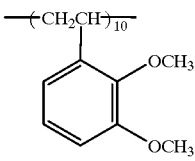 | 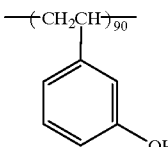 | 12,400 | 2.29 |
| (P-6) | 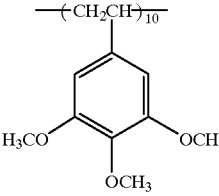 | 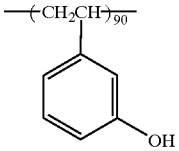 | 10,800 | 2.15 |
| (P-7) | 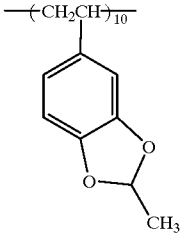 | 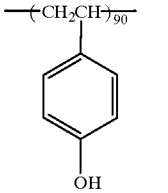 | 12,400 | 1.69 |
| (P-8) | 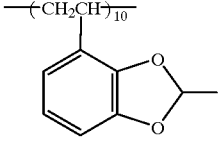 | 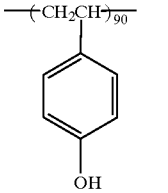 | 10,100 | 2.15 |
| (P-9) | 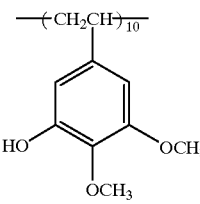 | 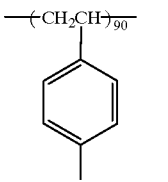 | 12,500 | 2.23 |
| (P-10) | 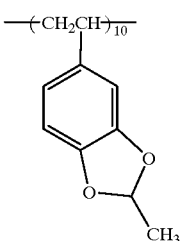 | 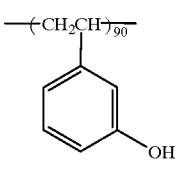 | 11,600 | 2.14 |

-continued
<Alkali-soluble resin constituting the invention>
| | | | Mw | Mw/Mn |
|---|---|---|---|---|
| (P-11) | 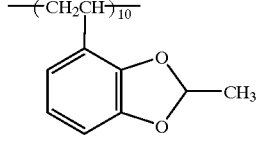 | 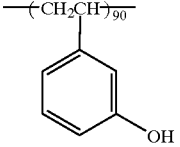 | 9,300 | 2.54 |
| (P-12) | 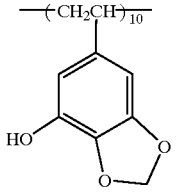 | 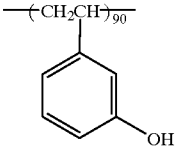 | 11,800 | 1.63 |
| (P-13) | 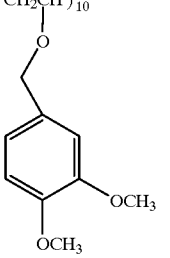 | 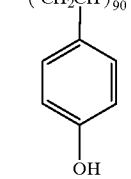 | 12,700 | 1.80 |
| (P-14) | 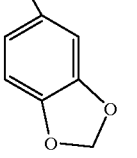 | 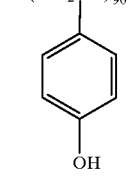 | 12,800 | 2.06 |
| (P-15) | 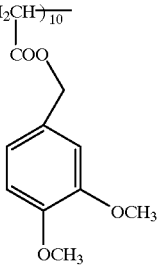 | 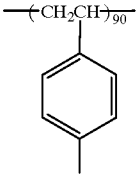 | 11,800 | 1.99 |
| (P-16) | 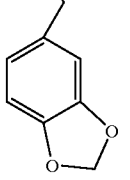 | 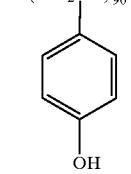 | 13,000 | 2.53 |

-continued
<Alkali-soluble resin constituting the invention>
| | | | Mw | Mw/Mn |
|---|---|---|---|---|
| (P-17) | 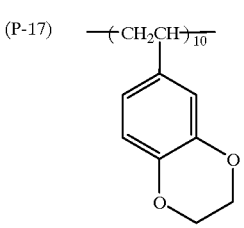 | | 9,900 | 2.53 |
| (P-18) | 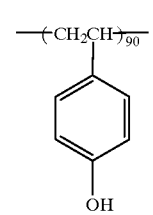 | | 10,900 | 2.42 |
| (P-19) | 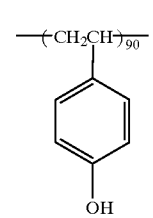 | | 11,700 | 2.18 |
| (P-20) | 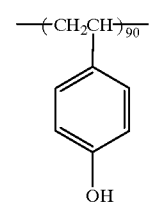 | | 9,800 | 2.02 |
| (P-21) | 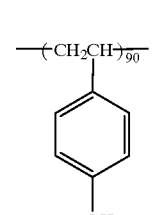 | | 11,800 | 2.00 |

-continued
<Alkali-soluble resin constituting the invention>
| | | | Mw | Mw/Mn |
|---|---|---|---|---|
| (P-22) | 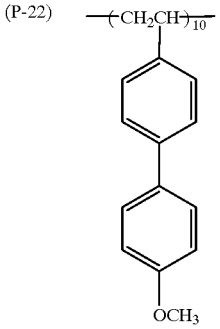 | 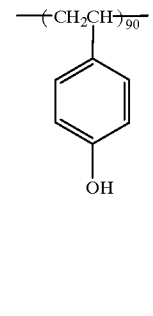 | 12,500 | 1.65 |
| (P-23) | 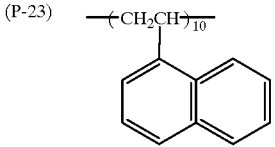 | 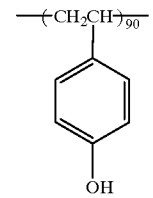 | 12,900 | 2.54 |
| (P-24) | 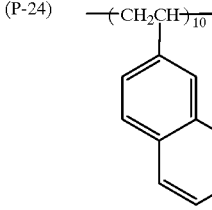 | 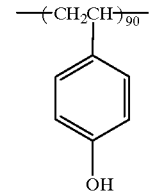 | 9,000 | 2.25 |
| (P-25) | 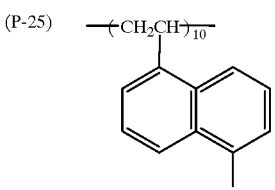 | 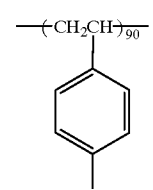 | 9,700 | 2.53 |
| (P-26) | 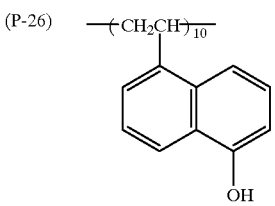 | 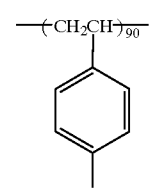 | 11,600 | 2.10 |
| (P-27) | 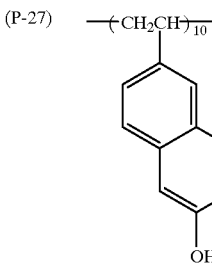 | 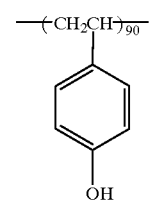 | 10,400 | 2.17 |

-continued

<Alkali-soluble resin constituting the invention>

| | | | Mw | Mw/Mn |
|---|---|---|---|---|
| (P-28) | –(CH$_2$CH)$_{10}$– with 6-methoxynaphthalen-2-yl substituent | –(CH$_2$CH)$_{90}$– with 4-hydroxyphenyl substituent | 10,700 | 2.33 |
| (P-29) | –(CH$_2$CH)$_{10}$– with –COO-(1-naphthyl) substituent | –(CH$_2$CH)$_{90}$– with 4-hydroxyphenyl substituent | 13,100 | 2.28 |
| (P-30) | –(CH$_2$CH)$_{10}$– with –COO-(2-naphthyl) substituent | –(CH$_2$CH)$_{90}$– with 4-hydroxyphenyl substituent | 10,300 | 2.49 |
| (P-31) | –(CH$_2$CH)$_{10}$– with –COO-(5-hydroxy-1-naphthyl) substituent | –(CH$_2$CH)$_{90}$– with 4-hydroxyphenyl substituent | 11,400 | 1.68 |
| (P-32) | –(CH$_2$CH)$_{10}$– with –COO-(6-hydroxy-2-naphthyl) substituent | –(CH$_2$CH)$_{90}$– with 4-hydroxyphenyl substituent | 11,600 | 2.43 |

-continued
<Alkali-soluble resin constituting the invention>
| | | | Mw | Mw/Mn |
|---|---|---|---|---|
| (P-33) | 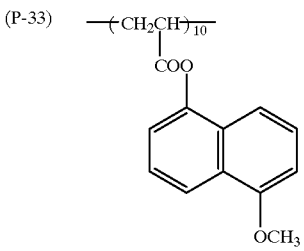 | 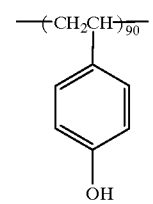 | 13,000 | 1.77 |
| (P-34) | 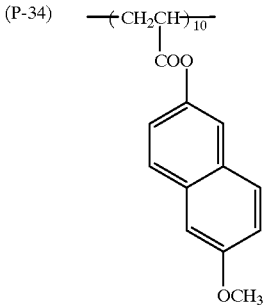 | 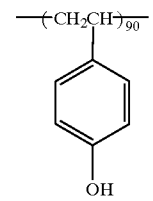 | 12,600 | 2.29 |
| (P-35) | 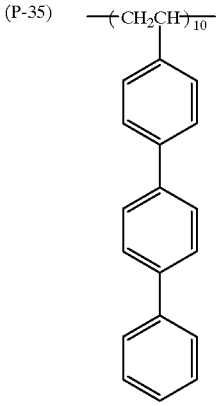 | 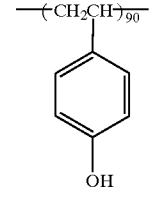 | 12,700 | 1.69 |
| (P-36) | 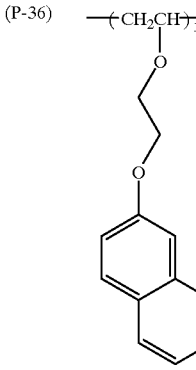 | 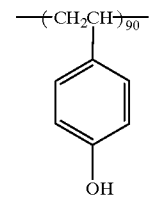 | 10,100 | 1.89 |

-continued
<Alkali-soluble resin constituting the invention>
| | | | Mw | Mw/Mn |
|---|---|---|---|---|
| (P-37) | 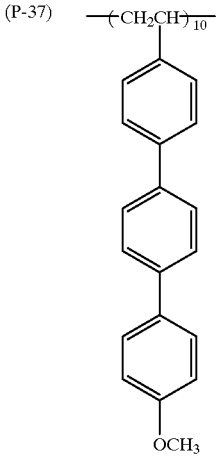 | 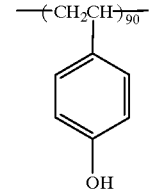 | 12,700 | 1.76 |
| (P-38) | 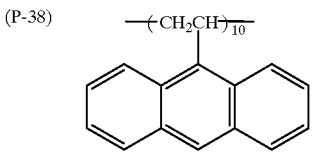 | 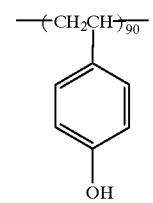 | 9,000 | 1.90 |
| (P-39) | 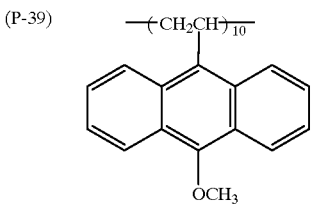 | 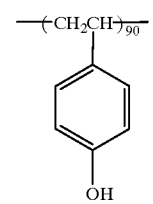 | 9,800 | 1.90 |
| (P-40) | 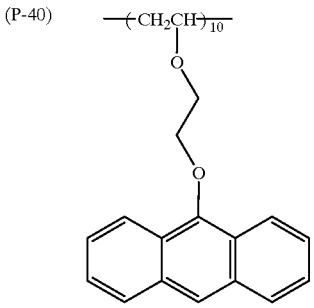 | 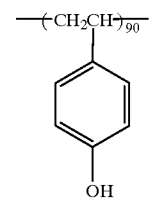 | 10,700 | 2.22 |
| (P-41) | 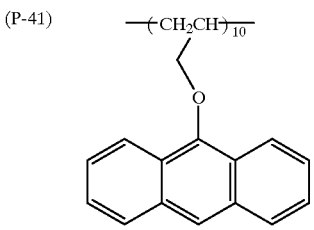 | 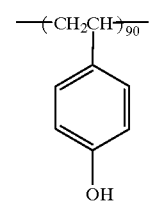 | 12,400 | 2.03 |

-continued
<Alkali-soluble resin constituting the invention>
| | | | Mw | Mw/Mn |
|---|---|---|---|---|
| (P-42) | 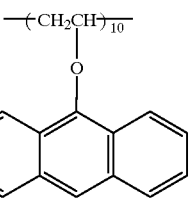 | 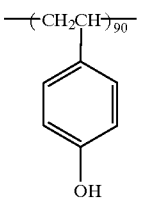 | 10,600 | 2.38 |
| (P-43) | 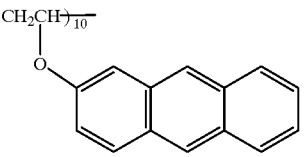 | 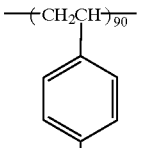 | 12,000 | 1.88 |
| (P-44) | 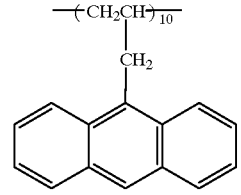 | 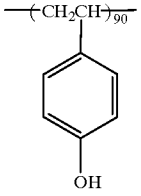 | 8,800 | 1.73 |
| (P-45) | 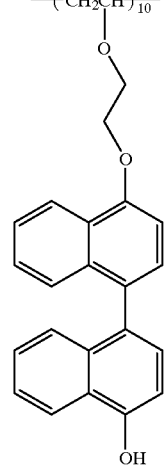 | 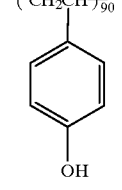 | 8,900 | 1.62 |
| (P-46) | 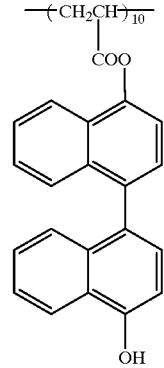 | 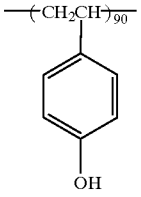 | 11,600 | 1.81 |

-continued
<Alkali-soluble resin constituting the invention>
| | | | Mw | Mw/Mn |
|---|---|---|---|---|
| (P-47) | 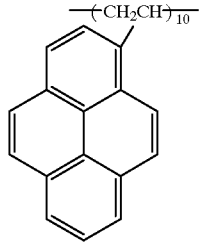 | 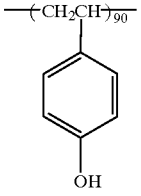 | 9,500 | 2.32 |
| (P-48) | 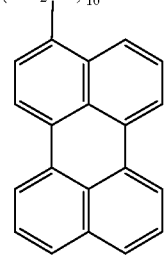 | 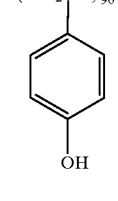 | 9,900 | 2.20 |
| (P-49) | 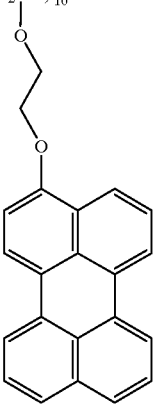 | 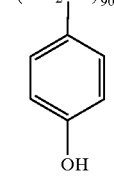 | 10,400 | 2.23 |
| (P-50) | 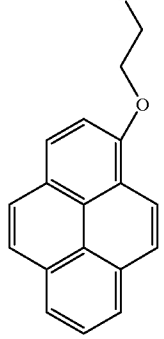 | 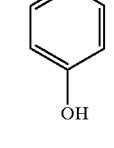 | 9,900 | 2.32 |

-continued

<Alkali-soluble resin constituting the invention>

|  |  | Mw | Mw/Mn |
|---|---|---|---|
| (P-51) structure | | 10,900 | 2.28 |

<Comparative alkali-soluble resins>

P-101: Poly-(p-hydroxystyrene)
Mw 10,000 Mw/Mn=1.4
P-102: Novolac resin
m-cresol/p-cresol=45/55 (mol ratio)
Mw 6,500

(2) Preparation of resist pattern:

The resist film was irradiated using an electron beam imaging apparatus (acceleration voltage 50 kV). After the irradiation, each resist film was heated using a vacuum adsorption type hot plate of 110° C. for 60 seconds, immersed in an aqueous solution of 2.38% tetramethylammonium hydroxide (TMAN) for 60 seconds, and after rinsing with water for 30 seconds, dried. The cross-sectional form of the pattern obtained was observed by a scanning type electron microscope.

Also, about the sensitivity, the minimum irradiated energy in the case of resolving the line (line:space=1:1) of 0.20 μm was defined as the sensitivity, and the limiting resolving power (the line and the space were separated and resolved) in the irradiated dose was defined as the resolving power. About the case that the line (line:space=1:1) of 0.20 μm was not resolved, the resolving power of the limit was defined as the resolving power. The performance evaluation results are shown in Table 2 below.

TABLE 2

| | Sensitivity ($\mu C/cm^2$) | Resolving power ($\mu m$) | Profile |
|---|---|---|---|
| Example 1-1 | 8 | 0.09 | rectangle |
| Example 1-2 | 9 | 0.10 | rectangle |
| Example 1-3 | 9 | 0.10 | rectangle |
| Example 1-4 | 10 | 0.11 | rectangle |
| Example 1-5 | 12 | 0.12 | rectangle |
| Example 1-6 | 8 | 0.10 | rectangle |
| Example 1-7 | 9 | 0.10 | rectangle |
| Example 1-8 | 10 | 0.11 | rectangle |
| Example 1-9 | 8 | 0.09 | rectangle |
| Example 1-10 | 10 | 0.10 | rectangle |
| Example 1-11 | 9 | 0.09 | rectangle |
| Example 1-12 | 9 | 0.09 | rectangle |
| Example 1-13 | 9 | 0.10 | rectangle |
| Example 1-14 | 10 | 0.10 | rectangle |
| Example 1-15 | 10 | 0.11 | rectangle |
| Example 1-16 | 9 | 0.12 | rectangle |
| Example 1-17 | 8 | 0.10 | rectangle |
| Example 1-18 | 8 | 0.10 | rectangle |
| Example 1-19 | 8 | 0.10 | rectangle |
| Example 1-20 | 7 | 0.10 | rectangle |
| Example 1-21 | 8 | 0.10 | rectangle |
| Example 1-22 | 8 | 0.11 | rectangle |
| Example 1-23 | 7 | 0.11 | rectangle |
| Example 1-24 | 7 | 0.11 | rectangle |
| Example 1-25 | 7 | 0.11 | rectangle |
| Example 1-26 | 8 | 0.10 | rectangle |
| Example 1-27 | 9 | 0.11 | rectangle |
| Example 1-28 | 9 | 0.10 | rectangle |
| Example 1-29 | 8 | 0.10 | rectangle |
| Example 1-30 | 8 | 0.10 | rectangle |
| Example 1-31 | 8 | 0.10 | rectangle |
| Example 1-32 | 8 | 0.09 | rectangle |
| Example 1-33 | 7 | 0.09 | rectangle |
| Example 1-34 | 7 | 0.10 | rectangle |
| Example 1-35 | 7 | 0.09 | rectangle |
| Example 1-36 | 8 | 0.10 | rectangle |
| Example 1-37 | 8 | 0.10 | rectangle |
| Example 1-38 | 8 | 0.09 | rectangle |
| Example 1-39 | 9 | 0.10 | rectangle |
| Example 1-40 | 9 | 0.10 | rectangle |
| Example 1-41 | 8 | 0.10 | rectangle |
| Example 1-42 | 9 | 0.11 | rectangle |
| Example 1-43 | 8 | 0.11 | rectangle |
| Example 1-44 | 9 | 0.10 | rectangle |
| Example 1-45 | 9 | 0.10 | rectangle |
| Example 1-46 | 8 | 0.09 | rectangle |
| Example 1-47 | 8 | 0.10 | rectangle |
| Example 1-48 | 9 | 0.11 | rectangle |
| Example 1-49 | 10 | 0.11 | rectangle |
| Example 1-50 | 9 | 0.10 | rectangle |
| Example 1-51 | 10 | 0.11 | rectangle |
| Example 1-52 | 9 | 0.10 | rectangle |
| Example 1-53 | 8 | 0.09 | rectangle |
| Example 1-54 | 8 | 0.10 | rectangle |
| Example 1-55 | 8 | 0.10 | rectangle |
| Example 1-56 | 8 | 0.11 | rectangle |
| Example 1-57 | 9 | 0.10 | rectangle |
| Example 1-58 | 7 | 0.11 | rectangle |
| Example 1-59 | 8 | 0.12 | rectangle |
| Example 1-60 | 8 | 0.11 | rectangle |
| Example 1-61 | 8 | 0.11 | rectangle |
| Example 1-62 | 8 | 0.11 | rectangle |
| Example 1-63 | 10 | 0.11 | rectangle |
| Example 1-64 | 15 | 0.15 | almost rectangle |
| Example 1-65 | 15 | 0.16 | almost rectangle |
| Example 1-66 | 17 | 0.16 | almost rectangle |
| Example 1-67 | 18 | 0.16 | almost rectangle |
| C.Ex 1-101 | 30 | 0.23 | almost rectangle |
| C.Ex 1-102 | 43 | 0.22 | reverse taper |
| C.Ex 1-103 | 29 | 0.18 | reverse taper |
| C.Ex 1-104 | 40 | 0.21 | reverse taper |

TABLE 2-continued

| | Sensitivity ($\mu C/cm^2$) | Resolving power ($\mu m$) | Profile |
|---|---|---|---|
| C.Ex 1-105 | 31 | 0.20 | reverse taper |
| C.Ex 1-106 | 35 | 0.22 | reverse taper |
| C.Ex 1-107 | 35 | 0.23 | reverse taper |
| C.Ex 1-108 | 40 | 0.25 | reverse taper |

C.Ex: Comparative Example

The results of Table 2 show that the compositions of the invention show a high sensitivity, a high resolving power, and a rectangular profile and thus have an excellent performance.

EXAMPLE 2

By the same method as in Example 1 except that the above-described resin (P-1''') was used, the evaluations were carried out. The results showed that the sensitivity of the resist composition was increased a little.

EXAMPLE 3

When the same procedures as Examples 1 and 2 were practiced using the compounds (I-9), (II-1), and (III-1) in place of the compounds generating an acid by the irradiation of electron beams or X-rays in Examples 1 and 2, the same results were obtained. Also, when the same procedures as Examples 1 and 2 were practiced by using Megafac R08, Megafac F176, and polycyloxane polymer KP 341 in place of the surface active agents in Examples 1 and 2, the same results were obtained. Furthermore, the same procedures as Examples 1 and 2 were practiced using polypropylene glycol monomethyl ether acetate/polypropylene glycol monomethyl ether=80/20 (vol/vol) as the solvent, the same results were obtained.

From the above results, it can be seen that the chemical amplification type negative-working resist compositions for electron beams or X-rays of the invention are suitable for an electron ray or X-ray lithography.

By the chemical amplification-type negative-working resist composition for electron beams or X-rays of the invention, a negative-working photosensitive composition excellent in the sensitivity and the resolving power and having a rectangular profile can be provided.

While the invention has been described in detail and with reference to specific embodiments thereof, it will be apparent to one skilled in the art that various changes and modifications can be made therein without departing from the spirit and scope thereof.

This application is based on Japanese patent application No. Hei-11-358022 filed on Dec. 16, 1999, the entire contents of which incorporated herein by reference.

What is claimed is:

1. A chemical amplification type negative-working resist composition for electron beams or X-rays containing:

(1) an alkali-soluble resin having a weight-average molecular weight exceeding 3,000 and not larger than 1,000,000, (2) a cross-linking agent causing crosslinkage with an acid, and (3) a compound generating an acid by the irradiation of electron beams or X-rays, wherein the alkali-soluble resin satisfies following conditions (a) and (b):

(a) the resin has at least one repeating unit derived from a monomer having a substituted or unsubstituted monocyclic or polycyclic aromatic ring having from 6 to 20 carbon atoms as ring-membered atoms and an ethylenically unsaturated group bonded to the aromatic ring directly or via a divalent linkage group selected from the group consisting of —OCH$_2$—, —COOCH$_2$—, —COO—, —CH$_2$O—, —CONH—, —OCH$_2$CH$_2$—O—, —O— and —CH$_2$—, and (b) the following relationship shown in Equation (1) exists between the π electrons of the aromatic ring(s) and the number of electrons of the unshared electron pairs of substituents on the aromatic ring(s) selected from the group consisting of a straight chain, branched, or cyclic alkoxy group, an alkenyloxy group, an aryloxy group, an aralkyloxy group having 1 to 12 carbon atoms, or a hydroxyl group, wherein adjacent two groups of two or more alkoxy groups or hydroxyl groups may combine with each other to form a ring structure of a 5-membered or higher-membered ring:

$$N\pi + \tfrac{1}{2} N_{lone} \geq 10 \qquad (1)$$

wherein N represents the total number of π electrons and $N_{lone}$ represents the total number of electrons of the unshared electron pairs.

2. The chemical amplification type negative-working resist composition for electron beams or X-rays according to claim 1, wherein the alkali-soluble resin has at least one repeating unit represented by the following formulae (1) to (5) as the constituting component;

(1)

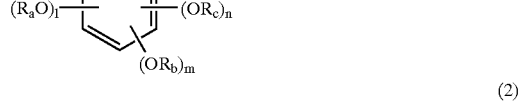

(2)

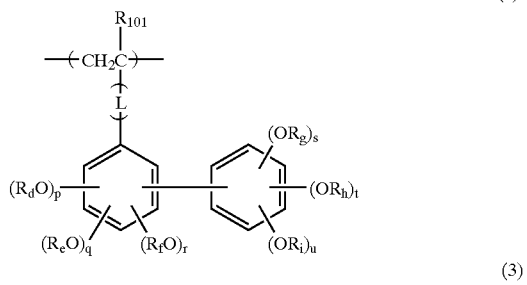

(3)

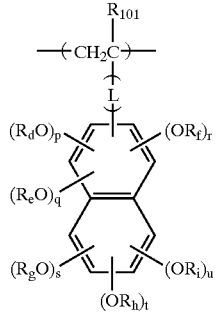

-continued (4)

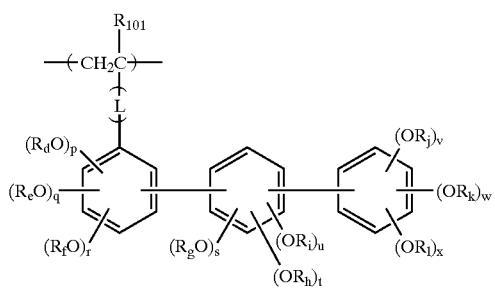

(5)

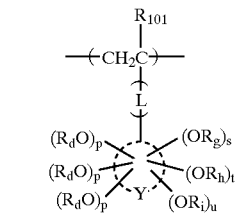

wherein 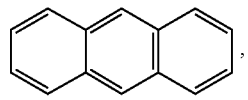 represents

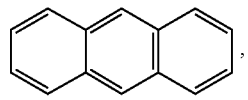,

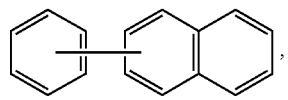,

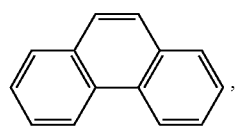,

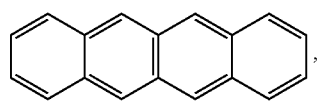,

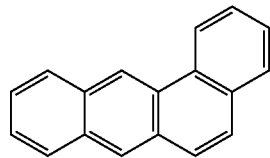,

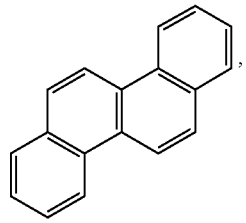,

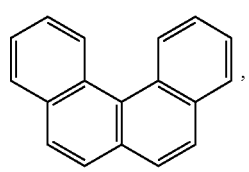,

-continued

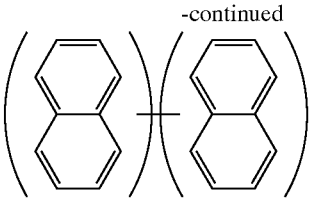

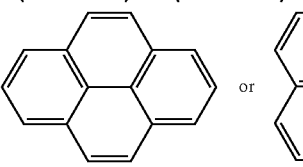 or 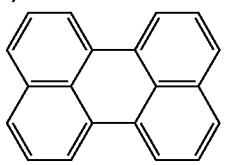

wherein $R_{101}$ represents a hydrogen atom or a methyl group; L represents said divalent linkage group; Ra, Rb, Rc, Rd, Re, Rf, Rg,, Rh, Ri, Rj, Rk, and Rl each independently represents a straight chain, branched, or cyclic alkyl group, alkenyl group, aryl group, or aralkyl group having from 1 to 12 carbon atoms, or a hydrogen atom, also they may combine with each other to form a ring of at least 5 members having not more than 24 carbon atoms; l, m, n, p, q, r, s, t, u, v, w, and x each represents an integer of from 0 to 3, and satisfy l+m+n=2 or 3, p+q+r=0, 1, 2, or 3, s+t+u=0, 1, 2, or 3, and v+w+x=0, 1, 2, or 3.

3. The chemical amplification type negative-working resist composition for electron beams or X-rays according to claim 1, wherein the crosslinking agent causing crosslinkage with an acid is a phenol derivative having from 1 to 6 benzene rings in the molecule, has a molecular weight of not larger than 1500, and has at least two hydroxymethyl groups and/or alkoxymethyl groups in the whole molecule, which is bonded to at least one of benzene ring atomic groups.

4. The chemical amplification type negative-working resist composition for electron beams or X-rays according to claim 1, wherein the molecular weight distribution of the alkali-soluble resin is from 1.0 to 1.5.

5. The chemical amplification type negative-working resist composition for electron beams or X-rays according to claim 1, wherein the compound generating an acid by electron beams or X-rays is a compound represented by the following formulae (I) to (III);

(I)

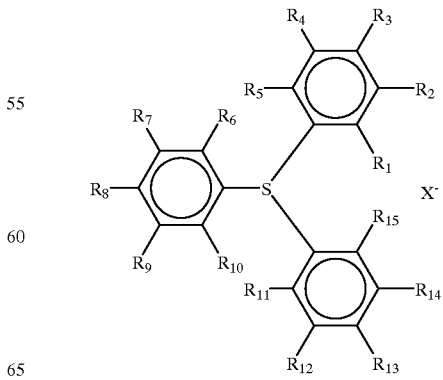

(II)

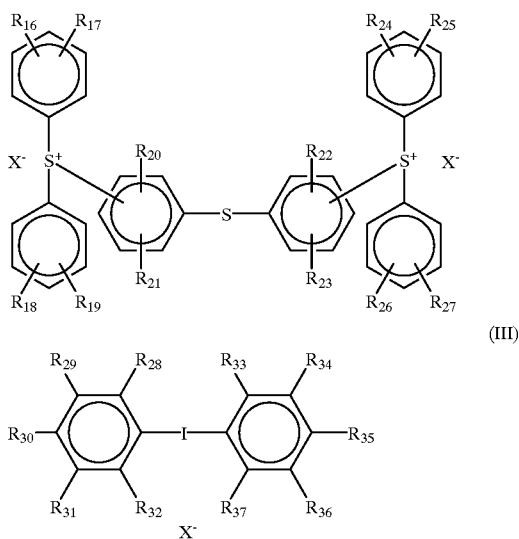

(III)

wherein $R_1$ to $R_{37}$, which may be the same or different, each represents a hydrogen atom, a straight chain, branched, or cyclic alkyl group, a straight chain, branched, or cyclic alkoxy group, a hydroxyl group, a halogen atom, or a —S—$R_{38}$ group wherein $R_{38}$ represents a straight chain, branched, or cyclic alkyl group or an aryl group; and at least two of $R_1$ to $R_{15}$, $R_{16}$ to $R_{27}$, or $R_{28}$ to $R_{37}$ may combine with each other to form a ring containing one kind or at least two kinds selected from a single bond, carbon, oxygen, sulfur, and nitrogen; and X⁻ represents the anion of benzenesulfonic acid, naphthalenesulfonic acid, or anthracenesulfonic acid having at least one kind selected from at least one fluorine atom, a straight chain, branched, or cyclic alkyl group substituted by at least one fluorine atom, a straight chain, branched, or cyclic alkoxy group substituted by at least one fluorine atom, an acyl group substituted by at least one fluorine atom, an acyloxy group substituted by at least one fluorine atom, a sulfonyl group substituted by at least one fluorine atom, a sulfonyloxy group substituted by at least one fluorine atom, a sulfonylamino group substituted by at least one fluorine atom, an aryl group substituted by at least one fluorine atom, an aralkyl group substituted by at least one fluorine atom, and an alkoxycarbonyl group substituted by at least one fluorine atom.

6. The chemical amplification type negative-working resist composition for electron beams or X-rays according to claim 1, wherein the composition further contains a surface active agent containing fluorine and/or silicon.

7. The chemical amplification type negative-working resist composition for electron beams or X-rays according to claim 1, wherein the composition contains propylene glycol monomethyl ether acetate as a solvent.

8. The chemical amplification type negative-working resist composition for electron beams or X-rays according to claim 1, wherein $N\pi+½N_{lone}$ in the equation 1 is in the range of from 10 to 40.

9. The chemical amplification type negative-working resist composition for electron beams or X-rays according to claim 1, wherein the weight-average molecular weight of the alkali-soluble resin exceeds 3,000 and not larger than 100,000.

10. The chemical amplification type negative-working resist composition for electron beams or X-rays according to claim 1, wherein the amount of the alkali-soluble resin is from 30 to 90% by weight to the total weight of the resist composition.

* * * * *